US012775210B2

(12) United States Patent
Zhang et al.

(10) Patent No.: US 12,775,210 B2
(45) Date of Patent: Oct. 27, 2026

(54) GRAY-TONE RESISTS AND PROCESSES

(71) Applicant: Meta Platforms Technologies, LLC, Menlo Park, CA (US)

(72) Inventors: Keren Zhang, Woodinville, WA (US); Xu Zhang, Lynnwood, WA (US); Feyza Dundar Arisoy, Redmond, WA (US); Joshua Andrew Kaitz, Woodinville, WA (US); Ankit Vora, Bothell, WA (US); Elliott Franke, Woodinville, WA (US); John Sporre, Bothell, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 695 days.

(21) Appl. No.: 17/970,439

(22) Filed: Oct. 20, 2022

(65) Prior Publication Data

US 2023/0130753 A1 Apr. 27, 2023

Related U.S. Application Data

(60) Provisional application No. 63/272,519, filed on Oct. 27, 2021.

(51) Int. Cl.
*G03F 7/039* (2006.01)
*G03F 7/09* (2006.01)

(52) U.S. Cl.
CPC .............. *G03F 7/039* (2013.01); *G03F 7/091* (2013.01)

(58) Field of Classification Search
None
See application file for complete search history.

(56) References Cited

U.S. PATENT DOCUMENTS 3,914,608 A 10/1975 Malmberg
3,980,883 A 9/1976 Franks
4,163,155 A 7/1979 Alles et al.
4,202,697 A 5/1980 Van Goethem et al.
4,696,885 A * 9/1987 Vijan ........................ G03F 7/16 430/935
5,510,420 A * 4/1996 Dammel ................... C08F 8/00 525/134
5,876,902 A 3/1999 Veneklasen et al.
5,888,698 A 3/1999 Koh et al.
5,943,550 A * 8/1999 Fulford, Jr. ............. H01L 22/20 438/308
6,087,464 A * 7/2000 Swarup ................ C09D 201/06 528/80
6,503,693 B1 * 1/2003 Mohondro ................ G03F 7/40 430/311
6,545,808 B1 4/2003 Ehbets et al.
6,583,933 B2 6/2003 Lamartine
6,602,647 B2 8/2003 Iwasa et al.
6,720,565 B2 4/2004 Innes et al.
6,753,129 B2 6/2004 Livesay et al.
6,812,471 B2 11/2004 Popiolkowski et al.
7,176,471 B2 2/2007 Ito et al.
7,218,449 B2 5/2007 Drenten et al.
7,481,565 B2 1/2009 Yu
7,663,124 B2 2/2010 Kasono et al.
8,168,373 B2 5/2012 Shew
8,614,052 B2 12/2013 Galler
8,749,890 B1 6/2014 Wood et al.
8,975,601 B1 3/2015 Chen
9,372,347 B1 6/2016 Levola et al.
9,378,926 B2 6/2016 Kuo et al.
9,423,360 B1 8/2016 Kostamo et al.
9,535,253 B2 1/2017 Levola et al.
9,690,208 B2 6/2017 Yu
9,715,067 B1 7/2017 Brown et al.
9,827,209 B2 11/2017 Kostamo
9,885,870 B2 2/2018 Stenberg et al.
10,018,844 B2 7/2018 Levola et al.
(Continued)

FOREIGN PATENT DOCUMENTS

CA 2214927 A1 4/1999
CN 1086479 A 5/1994
(Continued)

OTHER PUBLICATIONS

"Blazed Grating," From Wikipedia, the Free Encyclopedia [online], last edited on Dec. 26, 2016 [Retrieved on Feb. 10, 2017], 3 Pages. Retrieved from the Internet: URL: https://en.wikipedia.org/wiki/Blazed_grating.
Chandross E.A., et al., "New Photoresists for Deep Ultraviolet (300 nm) Exposure," Canadian Journal of Chemistry, 1983, vol. 61, pp. 817-823.
"Deep Grayscale E-Beam Lithography and Silicon Etching in Support of Planet-Finding Studies and Electrospray-Propelled Vehicles," Optical Components, Printed on Feb. 10, 2017, 6 Pages, Retrieved from Internet: URL: https://microdevices.jpl.nasa.gov/capabilities/opticalcomponents/process-for-3-d-surface-relief- profiles.php.
"Electron-Beam Lithography," From Wikipedia, the Free Encyclopedia [online], Sep. 12, 2017 [Retrieved on Feb. 10, 2017], 7 Pages, Retrieved from the Internet: URL: https://en.wikipedia.org/wiki/Electron-beam_lithography.
Final Office Action mailed Jul. 5, 2019 for U.S. Appl. No. 15/713,419, filed Sep. 22, 2017, 14 Pages.
(Continued)

*Primary Examiner* — Anca Eoff
(74) *Attorney, Agent, or Firm* — Greenberg Traurig, LLP

(57) ABSTRACT

Disclosed herein are techniques for fabricating a straight or slanted surface-relief grating with a uniform or non-uniform grating depth. According to certain embodiments, a gray-tone photoresist includes a novolac resin, a diazonaphthoquinone (DNQ) dissolution inhibitor, and one or more crosslinking agents for crosslinking the novolac resin at an elevated temperature to increase a glass transition temperature of the gray-tone photoresist and/or lower an etch rate of the gray-tone photoresist. After gray-tone photo exposure and development, the gray-tone photoresist is baked at the elevated temperature to crosslink. The crosslinked gray-tone photoresist has a higher density and a higher glass transition temperature, and thus would not become flowable to cause ripples or other surface roughness during the etching.

20 Claims, 14 Drawing Sheets

(56) References Cited

U.S. PATENT DOCUMENTS

| | | | |
|---|---|---|---|
| 10,067,347 | B2 | 9/2018 | Vallius et al. |
| 10,156,725 | B2 | 12/2018 | TeKolste et al. |
| 10,216,061 | B2 | 2/2019 | Popovich et al. |
| 10,241,330 | B2 | 3/2019 | Popovich et al. |
| 10,254,542 | B2 | 4/2019 | Kollin et al. |
| 10,274,823 | B2 | 4/2019 | Singh et al. |
| 10,317,677 | B2 | 6/2019 | Levola |
| 10,422,934 | B2 | 9/2019 | Valera et al. |
| 10,436,958 | B2 | 10/2019 | Melli et al. |
| 10,437,064 | B2 | 10/2019 | Popovich et al. |
| 10,459,145 | B2 | 10/2019 | Popovich et al. |
| 10,527,865 | B2 | 1/2020 | Yang et al. |
| 10,534,115 | B1 | 1/2020 | Calafiore et al. |
| 10,670,876 | B2 | 6/2020 | Popovich et al. |
| 10,823,894 | B2 | 11/2020 | Peroz et al. |
| 10,976,483 | B2 | 4/2021 | Vora et al. |
| 2001/0028039 | A1 | 10/2001 | Plontke et al. |
| 2001/0037037 | A1* | 11/2001 | Dietliker ................. G03F 7/038 522/39 |
| 2002/0122015 | A1 | 9/2002 | Song et al. |
| 2002/0146627 | A1 | 10/2002 | Suleski et al. |
| 2003/0007444 | A1 | 1/2003 | Tsukuda et al. |
| 2003/0077039 | A1 | 4/2003 | Kurihara et al. |
| 2003/0108819 | A1* | 6/2003 | Watanabe ................. G03F 7/40 430/311 |
| 2004/0033441 | A1* | 2/2004 | Yasunami ............. G03F 7/0382 430/270.1 |
| 2005/0035308 | A1 | 2/2005 | Javer et al. |
| 2005/0151284 | A1 | 7/2005 | Soeno |
| 2006/0003269 | A1* | 1/2006 | Ito ......................... G03F 7/2014 430/311 |
| 2006/0057468 | A1 | 3/2006 | Igawa et al. |
| 2006/0108542 | A1 | 5/2006 | Ito et al. |
| 2006/0110116 | A1 | 5/2006 | Sakai et al. |
| 2006/0115745 | A1 | 6/2006 | Yasuda et al. |
| 2006/0121396 | A1 | 6/2006 | Gauglitz et al. |
| 2006/0124869 | A1 | 6/2006 | Yoneyama et al. |
| 2007/0160336 | A1 | 7/2007 | Sakai et al. |
| 2008/0026258 | A1 | 1/2008 | Okino et al. |
| 2008/0094694 | A1 | 4/2008 | Yun et al. |
| 2008/0112670 | A1 | 5/2008 | Brooks et al. |
| 2008/0138013 | A1 | 6/2008 | Parriaux |
| 2008/0197295 | A1 | 8/2008 | Kaule et al. |
| 2008/0237460 | A1 | 10/2008 | Fragner et al. |
| 2009/0053965 | A1 | 2/2009 | Kim et al. |
| 2009/0123870 | A1 | 5/2009 | Usa et al. |
| 2009/0128911 | A1 | 5/2009 | Itzkovitch et al. |
| 2009/0134340 | A1 | 5/2009 | Furuhashi et al. |
| 2009/0166553 | A1 | 7/2009 | Okino |
| 2009/0230328 | A1 | 9/2009 | Komatsu et al. |
| 2010/0099041 | A1* | 4/2010 | Fujita .................... C08F 290/06 430/270.1 |
| 2010/0237262 | A1 | 9/2010 | Usa et al. |
| 2011/0038049 | A1 | 2/2011 | Vallius et al. |
| 2011/0255388 | A1 | 10/2011 | Goshima et al. |
| 2013/0027683 | A1 | 1/2013 | Yamashita |
| 2013/0051730 | A1 | 2/2013 | Travers et al. |
| 2013/0058370 | A1 | 3/2013 | Chang-Hasnain et al. |
| 2014/0104665 | A1 | 4/2014 | Popovich et al. |
| 2014/0140653 | A1 | 5/2014 | Brown et al. |
| 2014/0140654 | A1 | 5/2014 | Brown et al. |
| 2014/0204455 | A1 | 7/2014 | Popovich et al. |
| 2014/0252228 | A1 | 9/2014 | McMorran et al. |
| 2015/0002528 | A1 | 1/2015 | Bohn et al. |
| 2015/0289762 | A1 | 10/2015 | Popovich et al. |
| 2015/0344353 | A1 | 12/2015 | Han et al. |
| 2016/0035539 | A1 | 2/2016 | Sainiemi et al. |
| 2016/0116979 | A1 | 4/2016 | Border |
| 2016/0209657 | A1 | 7/2016 | Popovich et al. |
| 2017/0243718 | A1 | 8/2017 | Motosugi |
| 2017/0307886 | A1 | 10/2017 | Stenberg et al. |
| 2017/0307887 | A1 | 10/2017 | Stenberg et al. |
| 2018/0052276 | A1 | 2/2018 | Klienman et al. |
| 2018/0052501 | A1 | 2/2018 | Jones, Jr. et al. |
| 2018/0059297 | A1 | 3/2018 | Peroz et al. |
| 2018/0059304 | A1 | 3/2018 | Bhargava et al. |
| 2018/0095201 | A1 | 4/2018 | Melli et al. |
| 2018/0149791 | A1 | 5/2018 | Urness et al. |
| 2018/0188542 | A1 | 7/2018 | Waldern et al. |
| 2018/0232048 | A1 | 8/2018 | Popovich et al. |
| 2018/0275350 | A1 | 9/2018 | Oh et al. |
| 2018/0284440 | A1 | 10/2018 | Popovich et al. |
| 2019/0004219 | A1 | 1/2019 | Tervo |
| 2019/0041634 | A1 | 2/2019 | Popovich et al. |
| 2019/0324176 | A1 | 10/2019 | Colburn et al. |
| 2019/0324202 | A1 | 10/2019 | Colburn et al. |
| 2020/0026074 | A1 | 1/2020 | Waldern et al. |
| 2020/0088932 | A1 | 3/2020 | Schultz et al. |
| 2020/0209630 | A1 | 7/2020 | Schultz et al. |
| 2020/0271850 | A1 | 8/2020 | Vora et al. |
| 2020/0278554 | A1 | 9/2020 | Schultz et al. |

FOREIGN PATENT DOCUMENTS

| | | | |
|---|---|---|---|
| CN | 101765793 | A | 6/2010 |
| EP | 0454334 | A2 | 10/1991 |
| KR | 20150064240 | A | 6/2015 |
| WO | WO-2008102049 | A1 | 8/2008 |
| WO | WO-2019209422 | A1 | 10/2019 |
| WO | WO-2019209527 | A1 | 10/2019 |
| WO | WO-2020176528 | A1 | 9/2020 |

OTHER PUBLICATIONS

"Grayscale Lithography," Published Date: Sep. 30, 2017 [Retrieved on Oct. 29, 2018], 1 Page, Retrieved from the Internet: URL: https://www.eng.auburn.edu/~sylee/gray.html.

Hu L., et al., "Research Progress of Matrix Resin for Electron Beam Lithography Photoresist," China Academic Journal Electronic Publishing House, Feb. 2016, vol. 17, No. 1, 8 Pages.

International Search Report and Written Opinion for International Application No. PCT/US2020/019727, mailed May 29, 2020, 9 Pages.

International Search Report and Written Opinion for International Application No. PCT/US2022/048009, mailed Feb. 20, 2023, 9 pages.

Kirchner R., et al., "ZEP520A—A Resist for Electron-Beam Grayscale Lithography and Thermal Reflow," Microelectronic Engineering, Mar. 5, 2016, vol. 153, pp. 71-76, Retrieved from the Internet: URL: http://www.sciencedirect.com/science/article/pii/S016793171630017X.

Kristjansson S., et al., "Circular Grating Coupled DBR Laser With Integrated Focusing Outcoupler," IEEE Photonics Technology Letters, Apr. 1997, vol. 9 (4), pp. 416-418.

Li-Shu Z., et al., "Formation Method of Gray-Scale Mask Patterns Used for Producing Micro-Optical Elements," Optical-Electronic Engineering, Apr. 30, 2000, vol. 27, No. 2, 4 Pages.

"New Grayscale Technique Opens a Third Dimension for Nanoscale Lithography," National Institute of Standards and Technology [online], Aug. 28, 2013 [retrieved on Feb. 10, 2017], 3 Pages, Retrieved from the Internet: URL: https://www.nist.gov/news-events/news/2013/08/new-grayscale-technique-opens-third-dimension-nanoscale-lithography.

Non-Final Office Action mailed Sep. 4, 2020 for U.S. Appl. No. 16/799,532, filed Feb. 24, 2020, 15 Pages.

Non-Final Office Action mailed Mar. 6, 2019 for U.S. Appl. No. 15/713,419, filed Sep. 22, 2017, 22 Pages.

Non-Final Office Action mailed Nov. 10, 2020 for U.S. Appl. No. 16/437,636, filed Jun. 11, 2019, 17 Pages.

Non-Final Office Action mailed Apr. 21, 2020 for U.S. Appl. No. 16/799,532, filed Feb. 24, 2020, 12 Pages.

Notice of Allowance mailed Dec. 15, 2020 for U.S. Appl. No. 16/799,532, filed Feb. 24, 2020, 11 Pages.

Notice of Allowance mailed Sep. 17, 2019 for U.S. Appl. No. 15/713,419, filed Sep. 22, 2017, 14 Pages.

Office Action mailed Oct. 21, 2022 for Chinese Application No. 202080016924.4, filed Feb. 25, 2020, 28 Pages.

(56) References Cited

OTHER PUBLICATIONS

Office Action mailed Mar. 6, 2023 for Chinese Application No. 202080016924.4, filed Feb. 25, 2020, 13 Pages.
Restriction Requirement mailed Jul. 13, 2020 for U.S. Appl. No. 16/437,636, filed Jun. 11, 2019, 9 Pages.
Restriction Requirement mailed Dec. 18, 2018 for U.S. Appl. No. 15/713,419, filed Sep. 22, 2017, 7 Pages.
Satyanarayana V.S.V., et al., "Radiation-Sensitive Novel Polymeric Resist Materials: Iterative Synthesis and Their EUV Fragmentation Studies," Applied Materials, Feb. 27, 2014, pp. 4223-4232.
Steingruber R., et al., "Continuously Chirped Gratings for DFB-Lasers Fabricated by Direct Write Electron-Beam Lithography," Microelectronic Engineering, 2002, vol. 61-62, pp. 331-335.
The Resin "Composition and Properties of AZ® and TI Photoresists," MicroChemicals, retrieved on Jan. 2024, 8 Pages.
"Stitch-Free Lithography," Nanofluidics and more, Printed on Feb. 10, 2017, 1 Pages, Retrieved from the Internet: URL: https://www.raith.com/technology/stitch-free-lithography.html.
Yu L., et al., "The Evaluation of Photo/E-Beam Complementary Grayscale Lithography for High Topography 3D Structure," Proceedings of Society of Photo-optical Instrumentation Engineers [online], Mar. 29, 2013 [Retrieved on Feb. 10, 2017], vol. 8682, 3 Pages, Retrieved from the Internet: URL: http://proceedings.spiedigitallibrary.org/proceeding.aspx?articleid=1674320.

* cited by examiner

1300

| Chemistry | Label | Spin Speed/Hard Bake Temps | Remaining after strip(%) |
|---|---|---|---|
| ma-P 1225G | GT11 -1 | 100C/1.5min | 0 |
| | GT11 -2 | 100C+200C/3min | 60 |
| | GT11 -3 | 100C+250C/3min | 100 |
| ma-P 1225G + HMMM  | GT12 -1 | 100C/1.5min | 0 |
| | GT12 -2 | 100C+200C/3min | 100 |
| | GT12 -3 | 100C+250C/3min | 100 |
| ma-P 1225G + MBDA  | GT13 -1 | 100C/1.5min | 0 |
| | GT13 -2 | 100C+200C/3min | 100 |
| | GT13 -3 | 100C+250C/3min | 100 |

GRAY-TONE RESISTS AND PROCESSES

CROSS-REFERENCE TO RELATED APPLICATIONS

This application claims the benefit of and priority to U.S. Provisional Application No. 63/272,519, filed Oct. 27, 2021, entitled "GRAY-TONE RESISTS AND PROCESSES," which is herein incorporated by reference in its entirety for all purposes.

BACKGROUND

An artificial reality system, such as a head-mounted display (HIVID) or heads-up display (HUD) system, generally includes a near-eye display (e.g., a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example of an optical see-through AR system may use a waveguide-based optical display, where light of projected images may be coupled into a waveguide (e.g., a transparent substrate), propagate within the waveguide, and be coupled out of the waveguide at different locations. In some implementations, the light of the projected images may be coupled into or out of the waveguide using a diffractive optical element, such as a grating. Various techniques can be used to fabricate gratings or to fabricate a mold for imprinting gratings. However, these techniques are generally incapable of etching a grating structure with a desired three-dimensional profile, such as a grating structure having slanted ridges, different periods or duty cycles, and/or a height or depth profile that is non-uniform over the area of the grating structure.

SUMMARY

This disclosure relates generally to techniques for etching surface-relief structures. More specifically, disclosed herein are techniques for fabricating a straight or slanted surface-relief grating having a variable and precisely controlled etch depth, a variable duty cycle, and/or a variable period for a waveguide-based near-eye display system. Various inventive embodiments are described herein, including devices, systems, methods, materials, processes, and the like.

According to some embodiments, a gray-tone photoresist may include a novolac resin, a diazonaphthoquinone (DNQ) dissolution inhibitor, and one or more crosslinking agents configured to crosslink the novolac resin at an elevated temperature to increase a glass transition temperature of the gray-tone photoresist and/or lower an etch rate of the gray-tone photoresist. The one or more crosslinking agents may include, for example, a heterocyclic compound or an aromatic compound, and one or more crosslinking function groups attached to the heterocyclic compound or the aromatic compound, the one or more crosslinking function groups including an alkoxy group, a methoxy group, an epoxy group, a hydroxyl group, or a combination thereof. The gray-tone photoresist may be characterized by a non-binary linear or nonlinear response to exposure light dose.

According to some embodiments, a method may include forming a patterned etch mask on a substrate, depositing a thermally crosslinkable photoresist material layer on the patterned etch mask, exposing the photoresist material layer to exposure light through a gray-scale photomask, developing the exposed photoresist material layer to form a patterned photoresist layer having a non-uniform thickness, baking the patterned photoresist layer at an elevated temperature to form a crosslinked photoresist layer, and etching the crosslinked photoresist layer and the substrate to form a surface-relief grating in the substrate. The crosslinked photoresist layer may have a higher glass transition temperature than the patterned photoresist layer. Etching the crosslinked photoresist layer and the substrate may include etching the crosslinked photoresist layer and the substrate at a temperature lower than a glass transition temperature of the crosslinked photoresist layer but higher than a glass transition temperature of the patterned photoresist layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
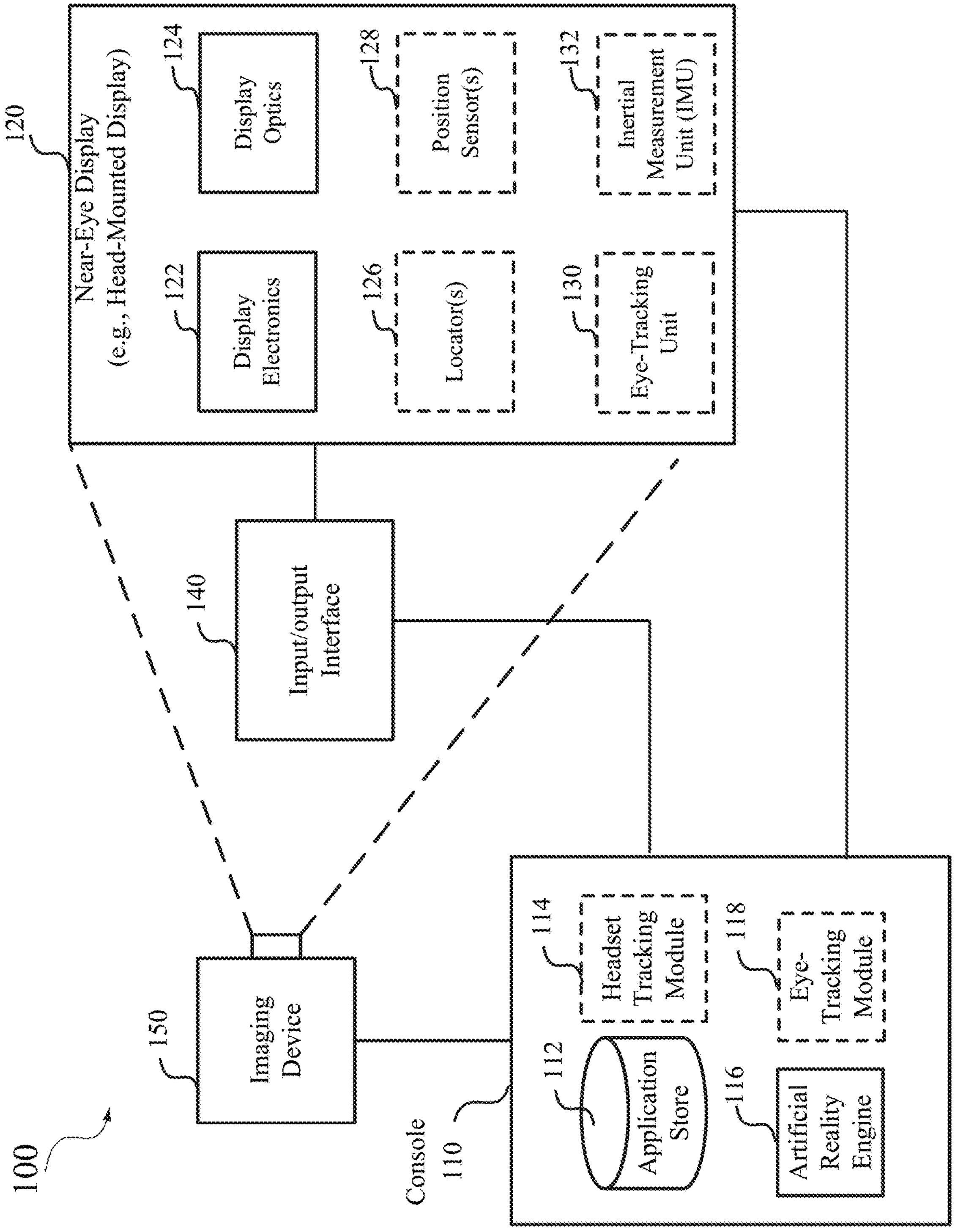
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to techniques for etching surface-relief structures. More specifically, disclosed herein are techniques for fabricating a straight or slanted surface-relief grating having a variable or uniform etch depth, a variable duty cycle, and/or a variable period for a waveguide-based near-eye display system. Various inventive embodiments are described herein, including devices, systems, methods, materials, processes, and the like.

Diffractive gratings, such as surface-relief gratings, may be used in a waveguide-based near-eye display system for coupling light into or out of a waveguide. In some waveguide-based near-eye display systems, a grating for input or output coupling may need to have a three-dimensional profile that is not uniform in the x, y, and/or z directions, in order to improve the field of view, improve the efficiency of light coupling, increase the brightness or power efficiency, reduce display artifacts (e.g., rainbow artifacts), achieve different diffraction characteristics (e.g., diffraction efficiencies and/or diffraction angles) at different areas of the grating, and/or improve other performance of the waveguide-based near-eye display systems. For example, the grating ridges may need to be slanted, the depth of the grating grooves may need to be different at different regions of the grating, the grating period and/or duty cycle of the grating may need to be different at different regions of the grating, and the like. While some lithographic techniques (e.g. photolithography, electron-beam lithography, etc.) can produce gratings with a customizable duty cycle and/or grating period, these lithographic techniques generally are not capable of modulating the vertical dimension (i.e., etch depth) of the grating relative to the surface of the substrate over the entire area of the grating.

In some processes, two mask layers may be used to manufacture a grating (or a nanoimprint mold) with a 3-D profile where the physical dimensions of the grating may vary in the x, y, and/or z directions. For example, a first mask layer may include a hard mask that is used to define a 2-dimensional pattern (e.g., in x-y plane). The second mask layer may include a photoresist material (e.g., a positive-tone photoresist) that has a non-binary linear or nonlinear response to exposure dose. The second mask layer may be exposed to light (e.g., UV light) through a gray-scale (also referred to as gray-tone) photomask that modulates the exposure dose over the area of the second mask layer. The gray-scale photomask may have a light transmittance that varies in one or two directions (e.g., in x and/or y directions). The exposed portions of the second mask layer may be more soluble in a photoresist developer and thus may be removed after the development to leave photoresist material of different depths in different areas. As such, different areas (e.g., at different x and/or y locations) of the second mask layer may have different thicknesses after the photoresist development. The photoresist material may have an etch rate similar to or greater than the etch rate of the substrate (e.g., quartz, $Si_3N_4$, or SiC) using a same etching process. The second mask layer and the substrate may be etched (e.g., by a vertical or slanted reactive ion etching (RIE) or ion beam etching (IBE) process) in the same etching process to transfer the thickness profile of the second mask layer to the substrate to form a straight or slanted grating having the desired 3-D profile, such as a variable-etch-depth surface-relief grating, in the substrate.

For a deep, straight or slanted grating with a small duty cycle or a large grating period, the grating grooves may be relatively wide or may have a lower aspect ratio (depth divided by width), and thus the residues from the etching may be relatively easy to remove, and thus the etch rate may be higher. However, for a deep grating with a large duty cycle or a small grating period where the grating grooves may have higher aspect ratios, even if the grating may be a straight grating, the residues from the etching may be relatively difficult to remove from the etched regions, and thus the etch rate may be relatively low. In addition, depletion of ions may occur when ions are captured by the sidewalls due to the angular distribution of incoming ions into the trench opening and the electrostatic fields in the trench, which may also reduce the etch rate. Thus, under a same etching condition (e.g., same ion beam dosage and etch time), regions of the grating having a smaller duty cycle may be etched faster and deeper than regions of the grating having a larger duty cycle. As such, for nanostructures with trenches of different dimensions and/or aspect ratios coexisting on a same substrate, the etch depths may be different for different trenches after a same etching process.

In some embodiments, gray-tone photoresists may be used to tune the etch depths for gratings with different duty cycles and/or different grating periods. For example, at regions with a smaller duty cycle and thus having wider grooves and a higher etch rate, the gray-tone photoresist layer may be thicker and thus more photoresists may need to be etched before the underlying substrate is etched, such that the etched grating in the underlying substrate may have similar depths at regions with different duty cycles. Gray-tone photoresists may also be used to protect areas that do not need to be etched.

In some dry etching systems (e.g., some IBE or RIE etching systems), during the etch, the surface of the gray-tone photoresist may become rough due to, for example, the high temperature condition in the etching chamber and the high-energy ion bombardments during etching. The high temperature etching condition and the ion bombardment may degrade and soften the gray-tone photoresists such that the gray-tone photoresists may become flowable. The slanted, high-energy ion bombardment may also create ripples on the surfaces of the flowable gray-tone photoresists. As such, the resultant photoresist layer may have ripples, for example, about 1 μm high and about 3 μm wide, and may appear hazy due to light scattering caused by the surface roughness. Since the gray-tone photoresist layer is used as the etch mask during subsequent etching, the surface roughness of the photoresist layer may result in gratings with undesired or uncontrolled etch depths. For example, some surface-relief gratings may have target grating groove depths about a few hundred nanometers. The large ripples in the photoresist layer may cause significant changes (e.g., at a large percentage) to the depths of the etched grating grooves, even though the etch rate of the underlying substrate may be much lower than the etch rate of the photoresists.

According to certain embodiments, a thermally crosslinkable photoresist having a non-binary linear or nonlinear response to exposure dosage (and thus can be used to record images) may be used as the gray-tone photoresist. After exposure to UV light through a gray-tone photomask and the develop of the gray-tone photoresist, a hard bake process may be performed to crosslink and harden the remaining photoresist and/or increase the glass-transition temperature $T_g$ of the resultant photoresist, such that the resultant photoresist may not become flowable to form ripples during the etch.

In some embodiments, the thermally crosslinkable photoresist may be formed by mixing a phenolic polymer such as novolac i-line resin (e.g., a phenolic novolac resin), and a dissolution inhibitor/photosensitizer such as diazonaphthoquinone (DNQ) or other diazoquinones (DQ). When the thermally crosslinkable photoresist is exposed to light, DNQ may act as a dissolution inhibitor so that the photoresist is insoluble in an aqueous base developer. In some embodiments, the thermally crosslinkable photoresist may also include an organic casting solvent. The novolac resin may provide certain physical properties such as good film-forming characteristics, etch resistance, and thermal stability. In one example, the novolac resin may include ma-P 1200G series from micro resist technology GmbH. In some embodiment, the novolac resin may include copolymers such as poly(styrene-co-glycidyl methacrylate). The DNQ dissolution inhibitor/photosensitizer may make it possible to image the photoresist by providing a photochemical route to modifying the dissolution rate of the photoresist in, for example, aqueous alkaline developers. The organic solvent may make it possible to spin-coat the photoresist to form uniform, glassy thin films. The organic solvent may include, for example, cyclohexanone, acetone, ethyl lactate, 1-methyl-2-pyrrolidinone (NMP), diglyme (diethyleneglycol dimethyl ether), butyl acetate, and propyleneglycol methyl ether acetate (PGMEA).

The thermally crosslinkable photoresist may include one or more crosslinking agents (e.g., aromatic crosslinking agents) that can lower the crosslinking temperature of the thermally crosslinkable photoresist, such that the thermally crosslinkable photoresist can be crosslinked below degradation temperature. For example, in some embodiments, the thermally crosslinkable photoresist may include novolac resins with molecular weights between about 1 k and about 100 k (e.g., between about 2 k and about 50 k, such as about 10 k), a DNQ compound, and zero to three crosslinking agents (e.g., no crosslinking agent, one crosslinking agent, or a blend of two or three crosslinking agents) at about 0.1-20 wt %.

The crosslinking agents may include, for example, one or more crosslinking function groups attached to aromatic compounds or heterocyclic compounds, such as five-member heterocyclic compounds, six-member heterocyclic compounds, aromatic compounds having one, two, three, or four heterocyclic compounds, or a combination thereof. The aromatic compounds or heterocyclic compounds may provide etch resistance to the overall formulation so that the etch resistance of the overall formulation may not decrease. The crosslinking function groups may include, for example, alkoxy groups, methoxy groups, epoxy groups, a hydroxyl group, or a combination thereof. Examples of the crosslinking agents include:

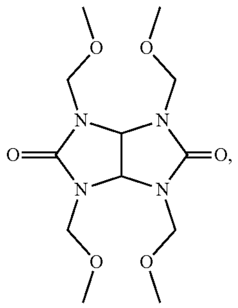

1,3,4,6-tetrakis(methoxymethyl)tetrahydroimidazo[4,5-*d*]imidazole•2,5(1*H*,3*H*)-dione

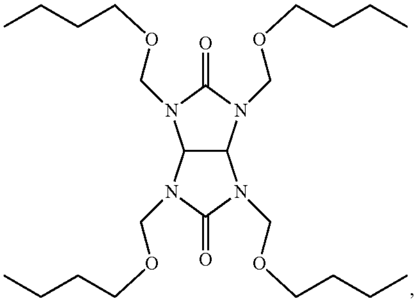

,

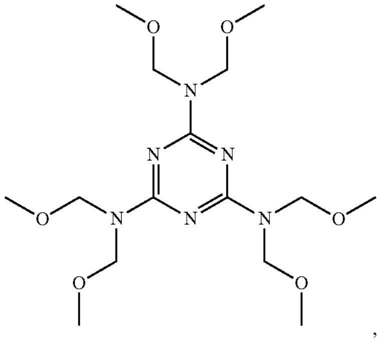

, $N^2$,$N^2$,$N^4$,$N^4$,$N^6$,$N^6$-hexakis(methoxymethyl)-1,3,5-triazine-2,4,6-triamine -continued

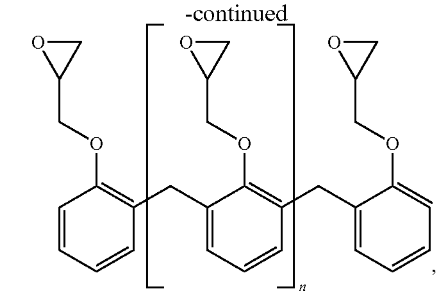

,

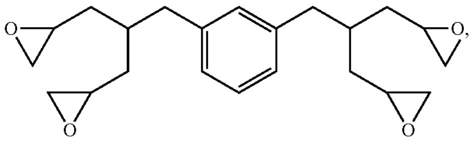

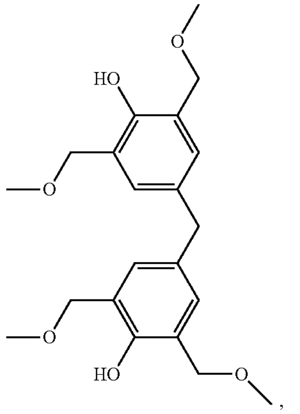

4,4′methylenebis(2,6-bis(methoxymethyl)phenol)

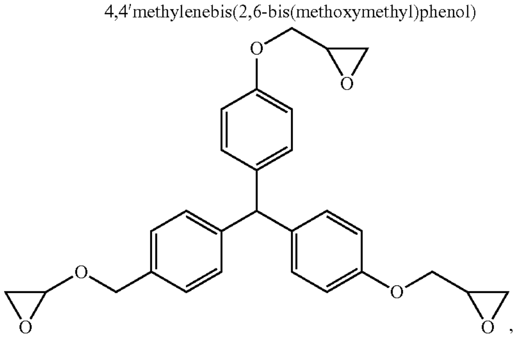

and

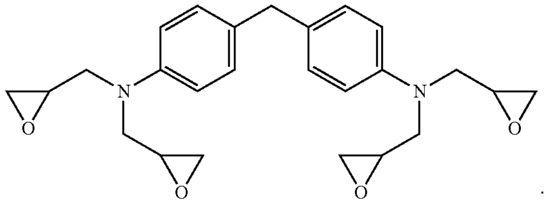

.

According to some embodiments, a method for fabricating a surface-relief grating may include forming a patterned etch mask on a substrate; depositing, on the patterned etch mask, a photoresist material layer that has a non-binary response to exposure dosage and is thermally crosslinkable; exposing the photoresist material layer to exposure light through a gray-scale photomask; developing the exposed photoresist material layer to form a patterned photoresist layer having a non-uniform thickness; baking the patterned photoresist layer at an elevated temperature to crosslink the patterned photoresist layer; and etching the patterned photoresist layer and the substrate to form a surface-relief grating having a uniform or non-uniform etch depth in the substrate. The method may also include removing the patterned photoresist layer and the patterned etch mask from the substrate after the etching to expose the surface-relief grating, and forming an overcoating layer and/or an antireflective coating layer on the surface-relief grating.

As used herein, the term "aliphatic" refers generally to a hydrocarbon moiety having at least one carbon atom to 50 carbon atoms ($C_{1-50}$), such as one to 25 carbon atoms ($C_{1-25}$), or one to ten carbon atoms ($C_{1-10}$), and which includes saturated groups such as alkanes (or alkyl) and unsaturated groups such as alkenes (or alkenyl), alkynes (or alkynyl), and also includes cyclic versions thereof, and further including straight- and branched-chain arrangements, and all stereo and position isomers as well. Such a hydrocarbon can be unsubstituted or substituted with one or more groups, such as halogens or groups described herein for an alkyl group.

The term "alkenyl" refers generally to an optionally substituted $C_{2-24}$ alkyl group having one or more double bonds. The alkenyl group can be cyclic (e.g., $C_{3-24}$ cycloalkenyl) or acyclic. The alkenyl group can also be substituted or unsubstituted. For example, the alkenyl group can be substituted with one or more substitution groups, as described herein for alkyl. Non-limiting unsubstituted alkenyl groups include $C_{2-8}$ alkenyl, $C_{2-6}$ alkenyl, $C_{2-5}$ alkenyl, $C_{2-4}$ alkenyl, or $C_{2-3}$ alkenyl. Exemplary, non-limiting alkenyl groups include vinyl or ethenyl ($-CH{=}CH_2$), 1-propenyl ($-CH{=}CHCH_3$), allyl or 2-propenyl ($-CH_2-CH{=}CH_2$), 1-butenyl ($-CH{=}CHCH_2CH_3$), 2-butenyl ($-CH_2CH{=}CHCH_3$), 3-butenyl (e.g. $-CH_2CH_2CH{=}CH_2$), 2-butenylidene (e.g., $=CH-CH{=}CHCH_3$), and the like.

The term "alkenylene" refers generally to a multivalent (e.g., bivalent) form of an alkenyl group, which is an optionally substituted $C_{2-24}$ alkyl group having one or more double bonds. The alkenylene group can be cyclic (e.g., $C_{3-24}$ cycloalkenyl) or acyclic. The alkenylene group can be substituted or unsubstituted. For example, the alkenylene group can be substituted with one or more substitution groups, as described herein for alkyl. Exemplary, non-limiting alkenylene groups include $-CH{=}CH-$ or $-CH{=}CHCH_2-$.

The term "alkoxy" refers generally to $-OR$, where R is an optionally substituted alkyl group, as described herein. Exemplary alkoxy groups include methoxy, ethoxy, butoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

The term "alkyl" or the prefix "alk" refers generally to a branched or unbranched saturated hydrocarbon group of 1 to 24 carbon atoms, such as methyl (Me), ethyl (Et), n-propyl (n-Pr or nPr), isopropyl (i-Pr or iPr), cyclopropyl, n-butyl (n-Bu or nBu), isobutyl (i-Bu or iBu), s-butyl (s-Bu or sBu), t-butyl (t-Bu or tBu), cyclobutyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic (e.g., $C_{3-24}$ cycloalkyl) or acyclic. The alkyl group can be branched or unbranched. The alkyl group can also be substituted or unsubstituted. For example, the alkyl group can include haloalkyl, in which the alkyl group is substituted by one or more halo groups, as described herein. In another example, the alkyl group can be substituted with one, two, three or, in the case of alkyl groups of two carbons or more, four substituents independently selected from the group consisting of: (1) $C_{1-6}$ alkoxy (e.g., —O-Ak, wherein Ak is optionally substituted $C_{1-6}$ alkyl); (2) amino (e.g., —$NR^{N1}R^{N2}$, where each of $R^{N1}$ and $R^{N2}$ is, independently, H or optionally substituted alkyl, or $R^{N1}$ and $R^{N2}$, taken together with the nitrogen atom to which each are attached, form a heterocyclic group); (3) aryl; (4) arylalkoxy (e.g., —O-Lk-Ar, wherein Lk is a bivalent form of optionally substituted alkyl and Ar is optionally substituted aryl); (5) aryloyl (e.g., —C(O)-Ar, wherein Ar is optionally substituted aryl); (6) carboxyaldehyde (e.g., —C(O)H); (7) carboxyl (e.g., —$CO_2H$); (8) $C_{3-8}$ cycloalkyl (e.g., a monovalent saturated or unsaturated non-aromatic cyclic $C_{3-8}$ hydrocarbon group); (9) heterocyclic (e.g., a 3-, 4-, 5-, 6- or 7-membered ring, unless otherwise specified, containing one, two, three, or four non-carbon heteroatoms, such as nitrogen, oxygen, phosphorous, sulfur, or halo); (10) heterocyclicoxy (e.g., —O-Het, wherein Het is heterocyclic, as described herein); (11) heterocyclicoyl (e.g., —C(O)-Het, wherein Het is heterocyclic, as described herein); (12) hydroxyl (e.g., —OH); (13) N-protected amino; (14) nitro (e.g., —$NO_2$); (15) oxo (e.g., =O); (16) —$CO_2R^A$, where $R^A$ is selected from the group consisting of (a) $C_{1-6}$ alkyl, (b) $C_{4-18}$ aryl, and (c) ($C_{4-18}$ aryl) $C_{1-6}$ alkyl (e.g., -Lk-Ar, wherein Lk is a bivalent form of optionally substituted alkyl group and Ar is optionally substituted aryl); (17) —C(O)$NR^BR^C$, where each of $R^B$ and $R^C$ is, independently, selected from the group consisting of (a) hydrogen, (b) $C_{1-6}$ alkyl, (c) $C_{4-18}$ aryl, and (d) ($C_{4-18}$ aryl) $C_{1-6}$ alkyl (e.g., -Lk-Ar, wherein Lk is a bivalent form of optionally substituted alkyl group and Ar is optionally substituted aryl); and (18) —$NR^GR^H$, where each of $R^G$ and $R^H$ is, independently, selected from the group consisting of (a) hydrogen, (b) an N-protecting group, (c) $C_{1-6}$ alkyl, (d) $C_{2-6}$ alkenyl (e.g., optionally substituted alkyl having one or more double bonds), (e) $C_{2-6}$ alkynyl (e.g., optionally substituted alkyl having one or more triple bonds), (f) $C_{4-18}$ aryl, (g) ($C_{4-18}$ aryl) $C_{1-6}$ alkyl (e.g., Lk-Ar, wherein Lk is a bivalent form of optionally substituted alkyl group and Ar is optionally substituted aryl), (h) $C_{3-8}$ cycloalkyl, and (i) ($C_{3-8}$ cycloalkyl) $C_{1-6}$ alkyl (e.g., -Lk-Cy, wherein Lk is a bivalent form of optionally substituted alkyl group and Cy is optionally substituted cycloalkyl, as described herein), wherein in one embodiment no two groups are bound to the nitrogen atom through a carbonyl group. The alkyl group can be a primary, secondary, or tertiary alkyl group substituted with one or more substituents (e.g., one or more halo or alkoxy). In some embodiments, the unsubstituted alkyl group is a $C_{1-2}$, $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkyl group.

The term "alkylene" refers generally to a multivalent (e.g., bivalent) form of an alkyl group, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

The term "alkylcarbonyl" refers generally to an alkyl group as previously defined appended to the parent molecular moiety through a carbonyl group. Exemplary, non-limiting alkylcarbonyl groups include methylcarbonyl, ethylcarbonyl, and isopropylcarbonyl among others.

The term "alkynyl" refers generally to an optionally substituted $C_{2-24}$ alkyl group having one or more triple bonds. The alkynyl group can be cyclic or acyclic and is exemplified by ethynyl, 1-propynyl, and the like. The alkynyl group can also be substituted or unsubstituted. For example, the alkynyl group can be substituted with one or more substitution groups, as described herein for alkyl. Non-limiting unsubstituted alkynyl groups include $C_{2-8}$ alkynyl, $C_{2-6}$ alkynyl, $C_{2-5}$ alkynyl, $C_{2-4}$ alkynyl, or $C_{2-3}$ alkynyl. Exemplary, non-limiting alkynyl groups include ethynyl (—C≡CH), 1-propynyl (—C≡$CCH_3$), 2-propynyl or propargyl (—$CH_2C$≡CH), 1-butynyl (—C≡$CCH_2CH_3$), 2-butynyl (—$CH_2C$≡$CCH_3$), 3-butynyl (—$CH_2CH_2C$≡CH), and the like.

The term "alkynylene" refers generally to a multivalent (e.g., bivalent) form of an alkynyl group, which is an optionally substituted $C_{2-24}$ alkyl group having one or more triple bonds. The alkynylene group can be cyclic or acyclic. The alkynylene group can be substituted or unsubstituted. For example, the alkynylene group can be substituted with one or more substitution groups, as described herein for alkyl. Exemplary, non-limiting alkynylene groups include —C≡C— or —C≡$CCH_2$—.

The term "amido" refers generally to —N($R^{N1}$)C(O)—, where $R^{N1}$ is H, optionally substituted alkyl, or optionally substituted aryl.

The term "amino" refers generally to —$NR^{N1}R^{N2}$, where each of $R^{N1}$ and $R^{N2}$ is, independently, H, optionally substituted alkyl, or optionally substituted aryl, or $R^{N1}$ and $R^{N2}$, taken together with the nitrogen atom to which each are attached, form a heterocyclic group, as defined herein.

The term "aminoalkyl" refers generally to an alkyl group, as defined herein, substituted by an amino group, as defined herein.

The term "aminoaryl" refers generally to an aryl group, as defined herein, substituted by an amino group, as defined herein.

The terms "aryl" and "aromatic" refer generally to a group that contains any carbon-based aromatic group including, but not limited to, phenyl, benzyl, anthracenyl, anthryl, benzocyclobutenyl, benzocyclooctenyl, biphenylyl, chrysenyl, dihydroindenyl, fluoranthenyl, indacenyl, indenyl, naphthyl, phenanthryl, phenoxybenzyl, picenyl, pyrenyl, terphenyl, and the like, including fused benzo-$C_{4-8}$ cycloalkyl radicals (e.g., as defined herein) such as, for instance, indanyl, tetrahydronaphthyl, fluorenyl, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents, such as any described herein for alkyl.

The term "azido" refers generally to —$N_3$.

The term "branched alkenyl" refers generally to an isomer of a straight chain alkenyl compound; one having alkyl groups bonded to the main carbon chain.

The term "carbonyl" refers generally to a —C(O)— group, which can also be represented as >C=O.

The term "cycloalkyl" refers generally to a monovalent saturated or unsaturated non-aromatic or aromatic cyclic hydrocarbon group of from three to eight carbons, unless otherwise specified, and is exemplified by cyclopropyl, cyclobutyl, cyclopentyl, cyclopentadienyl, cyclohexyl, cycloheptyl, bicyclo[2.2.1.]heptyl, and the like. The cycloalkyl group can also be substituted or unsubstituted. For example, the cycloalkyl group can be substituted with one or more groups including those described herein for alkyl.

The term "dicarbonyl" refers generally to any moiety or compound including two carbonyl groups, as defined herein. Non-limiting dicarbonyl moieties include 1,2-dicarbonyl (e.g., $R^{C1}$—C(O)—C(O)$R^{C2}$, in which each of $R^{C1}$ and $R^{C2}$ is, independently, optionally substituted alkyl, halo, optionally substituted alkoxy, hydroxyl, or a leaving group); 1,3-dicarbonyl (e.g., $R^{C1}$—C(O)—C($R^{1a}R^{2a}$)—C(O)$R^{C2}$, in which each of $R^{C1}$ and $R^{C2}$ is, independently, optionally substituted alkyl, halo, optionally substituted alkoxy, hydroxyl, or a leaving group and in which each of $R^{1a}$ and $R^{2a}$ is, independently, H or an optional substituent provided for alkyl, as defined herein); and 1,4-dicarbonyl (e.g., $R^{C1}$—C(O)—C($R^{1a}R^{2a}$)—C($R^{3a}R^{4a}$)—C(O)$R^{C2}$, in which each of $R^{C1}$ and $R^{C2}$ is, independently, optionally substituted alkyl, halo, optionally substituted alkoxy, hydroxyl, or a leaving group and in which each of $R^{1a}$, $R^{2a}$, $R^{3a}$, and $R^{4a}$ is, independently, H or an optional substituent provided for alkyl, as defined herein).

The term "heterocyclic" refers generally to a 3-, 4-, 5-, 6- or 7-membered ring, unless otherwise specified, containing one, two, three, or four non-carbon heteroatoms (e.g., independently selected from the group consisting of nitrogen, oxygen, phosphorous, sulfur, selenium, or halo). The 3-membered ring has zero to one double bonds, the 4- and 5-membered ring has zero to two double bonds, and the 6- and 7-membered rings have zero to three double bonds. The term "heterocyclic" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include acridinyl, adenyl, alloxazinyl, azaadamantanyl, azabenzimidazolyl, azabicyclononyl, azacycloheptyl, azacyclooctyl, azacyclononyl, azahypoxanthinyl, azaindazolyl, azaindolyl, azecinyl, azepanyl, azepinyl, azetidinyl, azetyl, aziridinyl, azirinyl, azocanyl, azocinyl, azonanyl, benzimidazolyl, benzisothiazolyl, benzisoxazolyl, benzodiazepinyl, benzodiazocinyl, benzodihydrofuryl, benzodioxepinyl, benzodioxinyl, benzodioxanyl, benzodioxocinyl, benzodioxolyl, benzodithiepinyl, benzodithiinyl, benzodioxocinyl, benzofuranyl, benzophenazinyl, benzopyranonyl, benzopyranyl, benzopyrenyl, benzopyronyl, benzoquinolinyl, benzoquinolizinyl, benzothiadiazepinyl, benzothiadiazolyl, benzothiazepinyl, benzothiazocinyl, benzothiazolyl, benzothienyl, benzothiophenyl, benzothiazinonyl, benzothiazinyl, benzothiopyranyl, benzothiopyronyl, benzotriazepinyl, benzotriazinonyl, benzotriazinyl, benzotriazolyl, benzoxathiinyl, benzotrioxepinyl, benzoxadiazepinyl, benzoxathiazepinyl, benzoxathiepinyl, benzoxathiocinyl, benzoxazepinyl, benzoxazinyl, benzoxazocinyl, benzoxazolinonyl, benzoxazolinyl, benzoxazolyl, benzylsultamyl, benzylsultimyl, bipyrazinyl, bipyridinyl, carbazolyl (e.g., 4H-carbazolyl), carbolinyl (e.g., β-carbolinyl), chromanonyl, chromanyl, chromenyl, cinnolinyl, coumarinyl, cytdinyl, cytosinyl, decahydroisoquinolinyl, decahydroquinolinyl, diazabicyclooctyl, diazetyl, diaziridinethionyl, diaziridinonyl, diaziridinyl, diazirinyl, dibenzisoquinolinyl, dibenzoacridinyl, dibenzocarbazolyl, dibenzofuranyl, dibenzophenazinyl, dibenzopyranonyl, dibenzopyronyl (xanthonyl), dibenzoquinoxalinyl, dibenzothiazepinyl, dibenzothiepinyl, dibenzothiophenyl, dibenzoxepinyl, dihydroazepinyl, dihydroazetyl, dihydrofuranyl, dihydrofuryl, dihydroisoquinolinyl, dihydropyranyl, dihydropyridinyl, dihydroypyridyl, dihydroquinolinyl, dihydrothienyl, dihydroindolyl, dioxanyl, dioxazinyl, dioxindolyl, dioxiranyl, dioxenyl, dioxinyl, dioxobenzofuranyl, dioxolyl, dioxotetrahydrofuranyl, dioxothiomorpholinyl, dithianyl, dithiazolyl, dithienyl, dithiinyl, furanyl, furazanyl, furoyl, furyl, guaninyl, homopiperazinyl, homopiperidinyl, hypoxanthinyl, hydantoinyl, imidazolidinyl, imidazolinyl, imidazolyl, indazolyl (e.g., 1H-indazolyl), indolenyl, indolinyl, indolizinyl, indolyl (e.g., 1H-indolyl or 3H-indolyl), isatinyl, isatyl, isobenzofuranyl, isochromanyl, isochromenyl, isoindazoyl, isoindolinyl, isoindolyl, isopyrazolonyl, isopyrazolyl, isoxazolidiniyl, isoxazolyl, isoquinolinyl, isoquinolinyl, isothiazolidinyl, isothiazolyl, morpholinyl, naphthindazolyl, naphthindolyl, naphthiridinyl, naphthopyranyl, naphthothiazolyl, naphthothioxolyl, naphthotriazolyl, naphthoxindolyl, naphthyridinyl, octahydroisoquinolinyl, oxabicycloheptyl, oxauracil, oxadiazolyl, oxazinyl, oxaziridinyl, oxazolidinyl, oxazolidonyl, oxazolinyl, oxazolonyl, oxazolyl, oxepanyl, oxetanonyl, oxetanyl, oxetyl, oxtenayl, oxindolyl, oxiranyl, oxobenzoisothiazolyl, oxochromenyl, oxoisoquinolinyl, oxoquinolinyl, oxothiolanyl, phenanthridinyl, phenanthrolinyl, phenazinyl, phenothiazinyl, phenothienyl (benzothiofuranyl), phenoxathiinyl, phenoxazinyl, phthalazinyl, phthalazonyl, phthalidyl, phthalimidinyl, piperazinyl, piperidinyl, piperidonyl (e.g., 4-piperidonyl), pteridinyl, purinyl, pyranyl, pyrazinyl, pyrazolidinyl, pyrazolinyl, pyrazolopyrimidinyl, pyrazolyl, pyridazinyl, pyridinyl, pyridopyrazinyl, pyridopyrimidinyl, pyridyl, pyrimidinyl, pyrimidyl, pyronyl, pyrrolidinyl, pyrrolidonyl (e.g., 2-pyrrolidonyl), pyrrolinyl, pyrrolizidinyl, pyrrolyl (e.g., 2H-pyrrolyl), pyrylium, quinazolinyl, quinolinyl, quinolizinyl (e.g., 4H-quinolizinyl), quinoxalinyl, quinuclidinyl, selenazinyl, selenazolyl, selenophenyl, succinimidyl, sulfolanyl, tetrahydrofuranyl, tetrahydrofuryl, tetrahydroisoquinolinyl, tetrahydroisoquinolyl, tetrahydropyridinyl, tetrahydropyridyl (piperidyl), tetrahydropyranyl, tetrahydropyronyl, tetrahydroquinolinyl, tetrahydroquinolyl, tetrahydrothienyl, tetrahydrothiophenyl, tetrazinyl, tetrazolyl, thiadiazinyl (e.g., 6H-1,2,5-thiadiazinyl or 2H,6H-1,5,2-dithiazinyl), thiadiazolyl, thianthrenyl, thianyl, thianaphthenyl, thiazepinyl, thiazinyl, thiazolidinedionyl, thiazolidinyl, thiazolyl, thienyl, thiepanyl, thiepinyl, thietanyl, thietyl, thiiranyl, thiocanyl, thiochromanonyl, thiochromanyl, thiochromenyl, thiodiazinyl, thiodiazolyl, thioindoxyl, thiomorpholinyl, thiophenyl, thiopyranyl, thiopyronyl, thiotriazolyl, thiourazolyl, thioxanyl, thioxolyl, thymidinyl, thyminyl, triazinyl, triazolyl, trithianyl, urazinyl, urazolyl, uretidinyl, uretinyl, uricyl, uridinyl, xanthenyl, xanthinyl, xanthionyl, and the like, as well as modified forms thereof (e.g., including one or more oxo and/or amino) and salts thereof. The heterocyclic group can be substituted or unsubstituted. For example, the heterocyclic group can be substituted with one or more substitution groups, as described herein for aryl.

The term "hydroxyl" refers generally to —OH.

The term "imino" refers generally to —NR—, in which R can be H or optionally substituted alkyl.

The term "oxo" refers generally to an =O group.

The term "oxy" refers generally to —O—.

Use of the above terms is meant to encompass substituted and unsubstituted moieties. Substitution may be by one or more groups such as alcohols, ethers, esters, amides, sulfones, sulfides, hydroxyl, nitro, cyano, carboxy, amines, heteroatoms, lower alkyl, lower alkoxy, lower alkoxycarbonyl, alkoxyalkoxy, acyloxy, halogens, trifluoromethoxy, trifluoromethyl, alkyl, aralkyl, alkenyl, alkynyl, aryl, cyano, carboxy, carboalkoxy, carboxyalkyl, cycloalkyl, cycloalkylalkyl, heterocyclic, alkylheterocyclic, heterocyclicalkyl, oxo, aryl sulfonyl and aralkyaminocarbonyl, or any of the substituents of the preceding paragraphs or any of those substituents either directly attached or by suitable linkers. The linkers are typically short chains of 1-3 atoms containing any combination of —C—, —C(O)—, —NH—, —S—, —S(O)—, —O—, —C(O)— or —S(O)O—. Rings may be substituted multiple times.

The term "lower" modifying "alkyl", "alkenyl", "alkynyl", "alkoxy" or "alkoxycarbonyl" refers to a $C_1$-$C_6$ unit for a particular functionality. For example, "lower alkyl" means $C_1$-$C_6$ alkyl.

The term "substituted" refers generally to having one or more substituent moieties whose presence does not interfere with the desired function or reactivity. Examples of substituents alkyl, alkenyl, alkynyl, cycloalkyl (non-aromatic ring), $Si(alkyl)_3$, $Si(alkoxy)_3$, alkoxy, amino, alkylamino, alkenylamino, amide, amidine, guanidine, hydroxyl, thioether, alkylcarbonyl, alkylcaronyloxy, alkoxycarbonyloxy, carbonate, alkoxycarbonyl, aminocarbonyl, alkylthiocarbonyl, phosphate, phosphate ester, phosphonato, cyano, halo, acylamino, imino, sulfhydryl, alkylthio, thiocarboxylate, dithiocarboxylate, sulfate, sulfato, sulfonate, sulfamoyl, sulfonamide, nitro, nitrile, azido, heterocyclic, ether, ester, silicon-containing moieties, thioester or a combination thereof. The substituents may themselves be substituted. For instance, an amino sub stituent may itself be mono or independently disubstituted by further substituents defined above, such as alkyl, alkenyl, alkynyl, and cycloalkyl (non-aromatic ring).

The term "unsubstituted" refers generally to any open valence of an atom being occupied by hydrogen. Also, if an occupant of an open valence position on an atom is not specified, then it is hydrogen.

The term "unsaturated" refers generally to a moiety that contains double or triple carbon-carbon bonds.

The term "unsaturated substituent" refers generally to a double or triple bond containing aliphatic chain, cyclic, aryl or heteroaryl group.

The term "independently selected", when referring to R substituent selection in a molecule containing multiple R groups, means that the selection of R substituents at different atoms of a molecule is independent and that the selection of R substituents at one atom having multiple R substituents is also independent.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2-4. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback applications, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light. In some embodiments, at least some of the functions of eye-tracking module 118 may be performed by eye-tracking unit 130.

Figure 2:
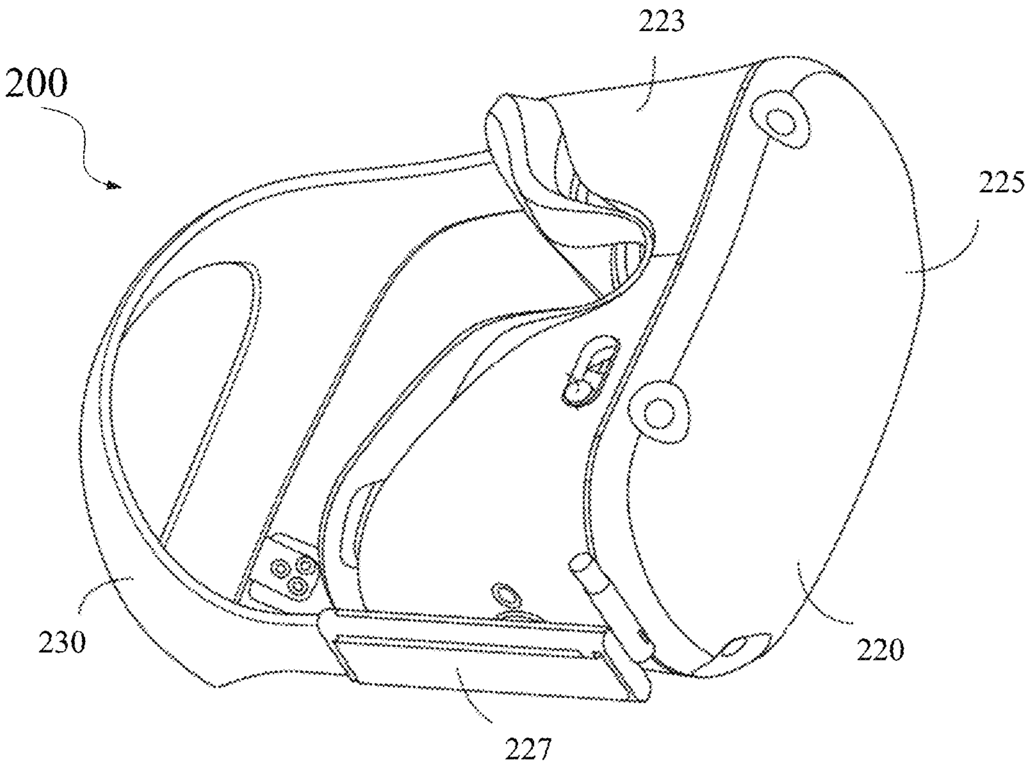
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
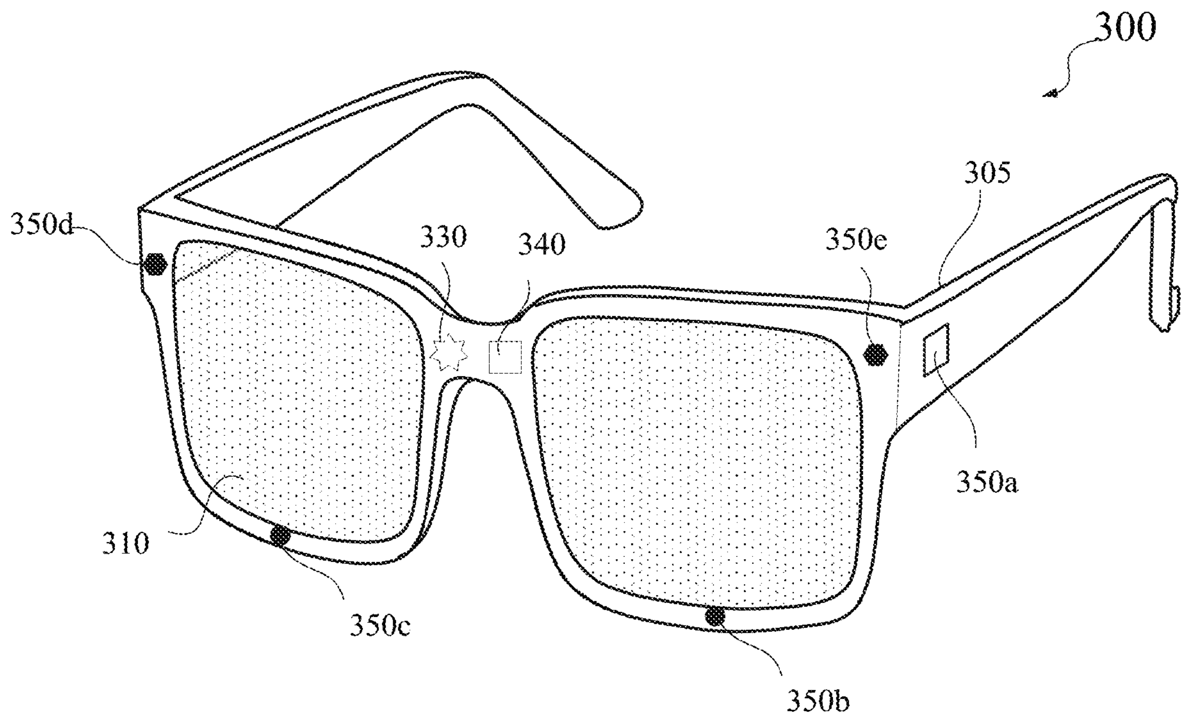
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350*a*-350*e* may be used as input devices to control or influence the displayed content of near-eye display 300, and/or to provide an interactive VR/AR/MR experience to a user of near-eye display 300. In some embodiments, sensors 350*a*-350*e* may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350*a*-350*e* in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
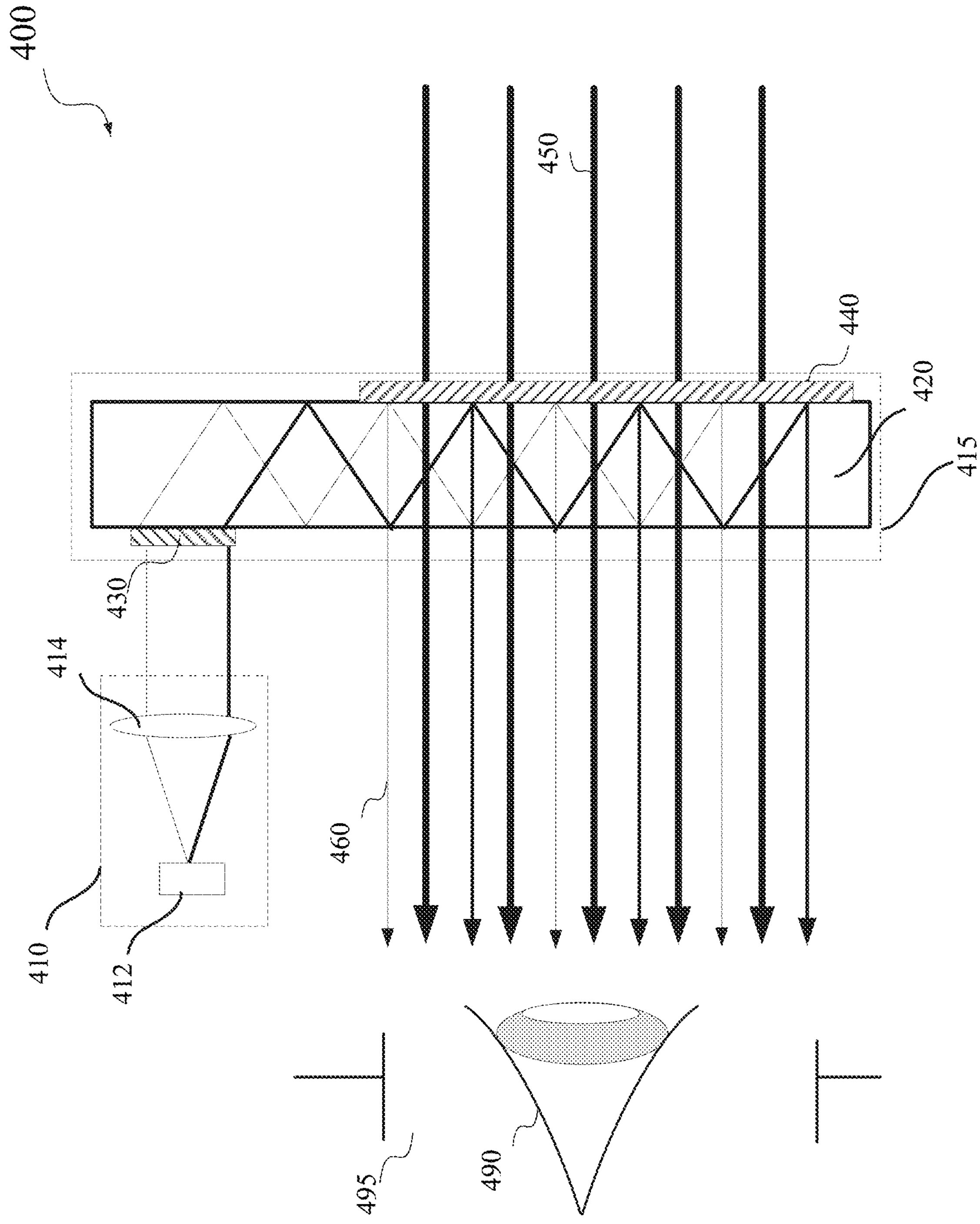
FIG. 4 illustrates an example of an optical see-through augmented reality system using a waveguide display according to certain embodiments.

FIG. 4 illustrates an example of an optical see-through augmented reality system 400 using a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), or a refractive coupler (e.g., a wedge or a prism). Input coupler 430 may have a coupling efficiency of greater than 30%, 50%, 75%, 90%, or higher for visible light. As used herein, visible light may refer to light with a wavelength between about 380 nm to about 750 nm. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of substrate 420 may range from, for example, less than about 1 mm to about 10 mm or more. Substrate 420 may be transparent to visible light. A material may be "transparent" to a light beam if the light beam can pass through the material with a high transmission rate, such as larger than 50%, 40%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 420 may include or may be coupled to a plurality of output couplers 440 configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

In many applications, to diffract light at a desired direction towards the user's eye, to achieve a desired diffraction efficiency for certain diffraction orders, to increase the field of view and reduce rainbow artifacts of a waveguide display, a grating coupler (e.g., input coupler 430 or output couplers 440) may include a blazed or slanted grating, such as a slanted surface-relief grating, where the grating ridges and grooves may be tilted relative to the surface normal of the grating coupler or waveguide. In addition, in some embodiments, it may be desirable that the grating has a height or depth profile that is non-uniform over the area of the grating, and/or a grating period or duty cycle that varies across the grating, in order to improve the performance of the grating, such as to achieve different diffraction characteristics (e.g., diffraction efficiencies and/or diffraction angles) at different areas of the grating.

Figure 5A:
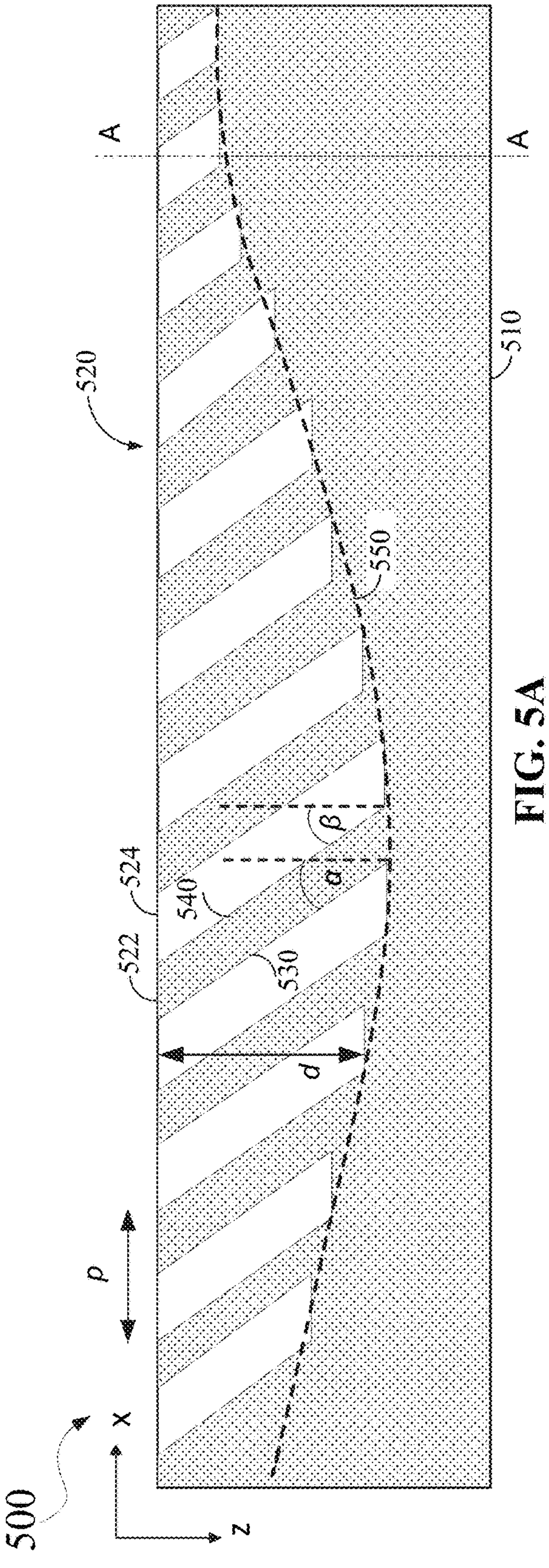
FIGS. 5A and 5B illustrate an example of a variable-etch-depth grating coupler in a waveguide display according to certain embodiments.
Figure 5B:
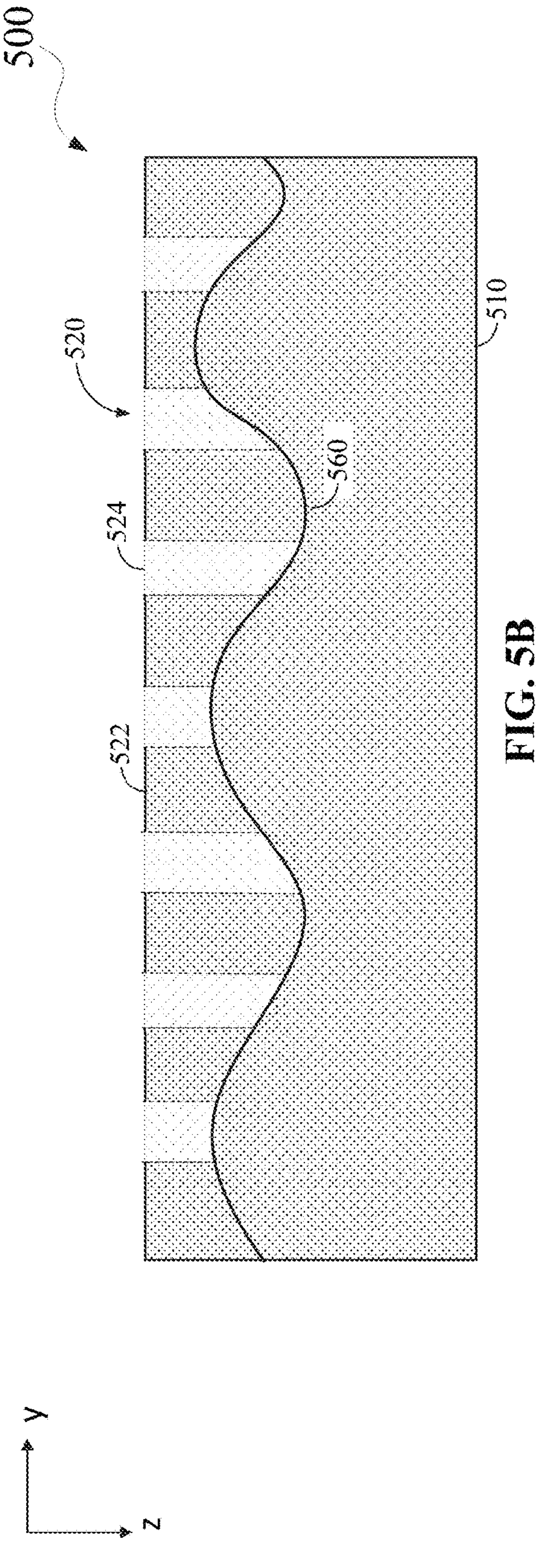

FIGS. 5A-5B illustrate cross-sectional views of an example of a slanted grating 520 used in a waveguide display 500 according to certain embodiments. Waveguide display 500 may include slanted grating 520 on a waveguide 510, such as substrate 420. Slanted grating 520 may act as a grating coupler for couple light into or out of waveguide 510. In some embodiments, slanted grating 520 may include a structure with a period p, which may be a constant or may vary across the area of slanted grating 520. Slanted grating 520 may include a plurality of ridges 522 and a plurality of grooves 524 between ridges 522. Each period of slanted grating 520 may include a ridge 522 and a groove 524, which may be an air gap or a region filled with a material with a refractive index different from the refractive index of ridge 522. The ratio between the width of a ridge 522 and the grating period p may be referred to as the duty cycle. Slanted grating 520 may have a duty cycle ranging, for example, from about 40% to about 60%, from about 30% to about 70%, from about 20% to about 80%, or from about 10% to about 90% or greater. In some embodiments, the duty cycle may vary from period to period or from area to area. In some embodiments, the period p of the slanted grating may vary from one area to another on slanted grating 520, or may vary from one period to another (i.e., chirped) on slanted grating 520.

Ridges 522 may be made of a material, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 522 may include a leading edge 530 with a slant angle α and a trailing edge 540 with a slant angle β. In some embodiments, leading edge 530 and trailing edge 540 of each ridge 522 may be parallel to each other. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger, such as about 45° or larger. In some embodiments, slant angle α and/or slant angle β may also vary from ridge to ridge in slanted grating 520.

Each groove 524 may have a depth d in the z direction, which may be a constant or may vary across the area of slanted grating 520 as illustrated by an example of a depth profile 560 in a y-z plane shown in FIG. 5B (e.g., along a line A-A in FIG. 5A). In embodiments where slanted grating 520 is a two-dimensional grating, the cross-sectional view of the y-z plane may show a plurality of grating grooves 524. In embodiments where slanted grating 520 is a one-dimensional grating, the cross-sectional view of the y-z plane may not show a plurality of grating grooves 524. In some embodiments, the depths of grooves 524 may vary across the area of slanted grating 520 according to a pattern or a depth profile 550 in an x-z plane. In some embodiments, the depths of grooves 524 may include multiple depth levels, such as 8 depth levels, 16 depth levels, 32 depth levels, or more. In some embodiments, the depths of grooves 524 may vary from 0 to about 100 nm, 200 nm, 300 nm, or deeper. In some implementations, grooves 524 between ridges 522 may be over-coated or filled with a material having a refractive index higher or lower than the refractive index of the material of ridges 522. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 524. In some embodiments, a low refractive index material, such as silicon oxide, alumina, porous silica, or fluorinated low index monomer (or polymer), may be used to fill grooves 524. As a result, the difference between the refractive index of the ridges and the refractive index of the grooves may be greater than 0.1, 0.2, 0.3, 0.5, 1.0, or higher.

As such, slanted grating 520 may have a 3-D structure, the physical dimensions of which may vary in the x, y, and/or z directions. For example, the grating period or duty cycle of slanted grating 520 may vary in the x-y plane and may also vary in the z-direction if slant angle α is different from slant angle β. The depths of grooves 524 in the z direction may vary in the x and/or y directions. Even though FIG. 5B shows that the grating ridges may be vertical in a y-z plane, the grating ridges in a y-z plane may also be slanted in some embodiments. In some embodiments, the slant angle α and/or β with respect to the z direction may vary along the x and/or y directions in slanted grating 520.

It can be challenging to fabricate the slant grating shown and described above with respect to FIGS. 5A and 5B. For example, many grating etching processes may only uniformly etch a substrate to fabricate a grating with a uniform thickness or depth.

In some processes, two mask layers may be used to manufacture a grating (or a nanoimprint mold) with a 3-D profile where the physical dimensions of the grating may vary in the x, y, and/or z directions. A first mask layer may include a hard mask that is used to define a 2-dimensional pattern (e.g., in x-y plane). The second mask layer may include a photoresist material (e.g., a positive-tone photoresist) that has a linear or non-binary nonlinear response to exposure dose, and may have an etch rate similar to or faster than the underlying substrate in a same etching process. The second mask layer may be exposed to light (e.g., UV light) through a gray-scale (also referred to as gray-tone) photomask that modulates the exposure dose over the area of the second mask layer. The gray-scale photomask may have a light transmittance that varies in one or two directions (e.g., in x and/or y directions). The exposed portions of the second mask layer may be more soluble in a photoresist developer and thus may be removed after the development to leave photoresist material of different depths in different areas. As such, different areas (e.g., at different x and/or y locations) of the second mask layer may have different thicknesses after the photoresist development. The photoresist material may also have an etch rate similar to or greater than the etch rate of the substrate (e.g., quartz, $Si_3N_4$, or SiC) using a same etching process. The second mask layer and the substrate may be etched (e.g., by a vertical or slanted reactive ion etching (RIE) or ion beam etching (IBE) process) in the same etching process to transfer the thickness profile of the second mask layer to the substrate to form a straight or slanted grating having the desired 3-D profile, such as a variable-etch-depth grating, in the substrate.

To fabricate a variable-etch-depth grating having a continuous thickness profile or a thickness profile that includes many different depth levels, the photoresist material for fabricating the variable-etch-depth grating may need to be sensitive to UV light (e.g., with a wavelength shorter than 365 nm or 300 nm, such as 240-280 nm, 193 nm, or 157 nm) and may have an etch rate similar to or higher than the etch rate of a substrate in which the variable-etch-depth grating is to be fabricated. In some embodiments, the photoresist material may have a non-binary linear or nonlinear response to UV exposure dose, such that a depth of an exposed portion of the photoresist materials in the photoresist material layer may correlate with the exposure dose, such as being a linear or nonlinear function of the exposure dose. The photoresist material layer including the photoresist material may be deposited on a substrate having an attached etch mask that defines a two-dimensional pattern of a grating. The photoresist material layer may be exposed to different doses of UV light at different regions through a gray-scale photomask. After the exposure and development, the photoresist material layer may have a non-uniform thickness where the thickness may vary according to a desired pattern. The photoresist material layer with the patterned non-uniform thickness and the underlying substrate may be etched straightly or at a certain slant angle to form a straight or slanted grating structure in the substrate, where the grating structure may have a non-uniform depth profile corresponding to the non-uniform thickness of the photoresist material layer before etching. Because the two-dimensional pattern of the grating can be defined by the etch mask, the depth profile of the grating can be defined by the gray-scale photomask, and the slant angle of the grating at a region of the grating can be defined by the etch angle for the region, a grating with a desired 3-D structure can be fabricated using the techniques disclosed herein.

To achieve a continuous thickness profile or a thickness profile that includes many different levels of depth, the photoresist material for the second mask layer may need to have a low contrast and non-binary linear or nonlinear response to exposure dose such that different exposure doses can correspond to different exposure depths, where the exposed portions may be more soluble in the developer and thus may be removed after the development to leave photoresist material of different depths in different areas. The photoresist material may have an etch rate similar to or greater than the etch rate of the substrate (e.g., quartz, $Si_3N_4$, or SiC) using a same etching process, such that the thickness profile of the photoresist material may be transferred to the substrate by the etching process. In some embodiments, the photoresist material may be a material that is removable by plasma, such as an organic material.

In some cases, during photolithography, exposure light may be reflected at the interfaces between the photoresist material layer and media adjacent to the photoresist material, such as the substrate or air. The light reflected at different surfaces of the photoresist material layer may at least partially constructively interfere with each other to increase overall reflection or interfere with the exposure light to cause standing waves in the gray-scale photoresist material, decrease exposure latitude, reduce the depth of focus, cause reflective notching, change the dimensions of the features formed in the gray-scale photoresist material, and/or increase the variability and non-uniformity of the straight or slanted grating having the desired 3-D profile, such as a variable-etch-depth grating. For example, in some cases, light reflected at the top and bottom surface of the photoresist material layer may at least partially constructively interfere with each other to increase the overall reflection. In some cases, light reflected at the bottom surface of the photoresist material layer may interfere with the exposure light propagating in the photoresist material layer to form standing waves (and thus light intensity distribution in the thickness direction) in the photoresist material layer. The light intensity distribution in the photoresist material layer may cause the width of the features formed in the photoresist material layer after the development to vary in the thickness direction of the photoresist material layer, thereby forming ripples in the sidewalls of the features in the photoresist material layer. The ripples cam change the lateral dimensions of the features, and may also cause diffusion of the etching beams during etching using the photoresist material layer as etch mask.

In some embodiments, to reduce light reflection, increase the resolution of the gray tone photolithography, increase the depth of focus, and improve the uniformity of the manufactured gratings, one or more anti-reflective layers may be coated under and/or above the photoresist material for the second mask layer. The anti-reflective layers coated at the surfaces of the photoresist material may help to reduce the light reflection at the interfaces between the photoresist material and adjacent media. For example, the anti-reflective layers may cause destructive interference between light reflected at different surfaces of the anti-reflective layers, or may absorb light passing through the anti-reflective layers to reduce the light reflection at the bottom surface of the anti-reflective layers. In some embodiments, the anti-reflective layers, such as a bottom anti-reflective coating (BARC) layer, may have an etch rate comparable to (e.g., approximately similar to) the etch rate of the photoresist material or the substrate (e.g., quartz or $Si_3N_4$) using a same etching process.

Figure 6:
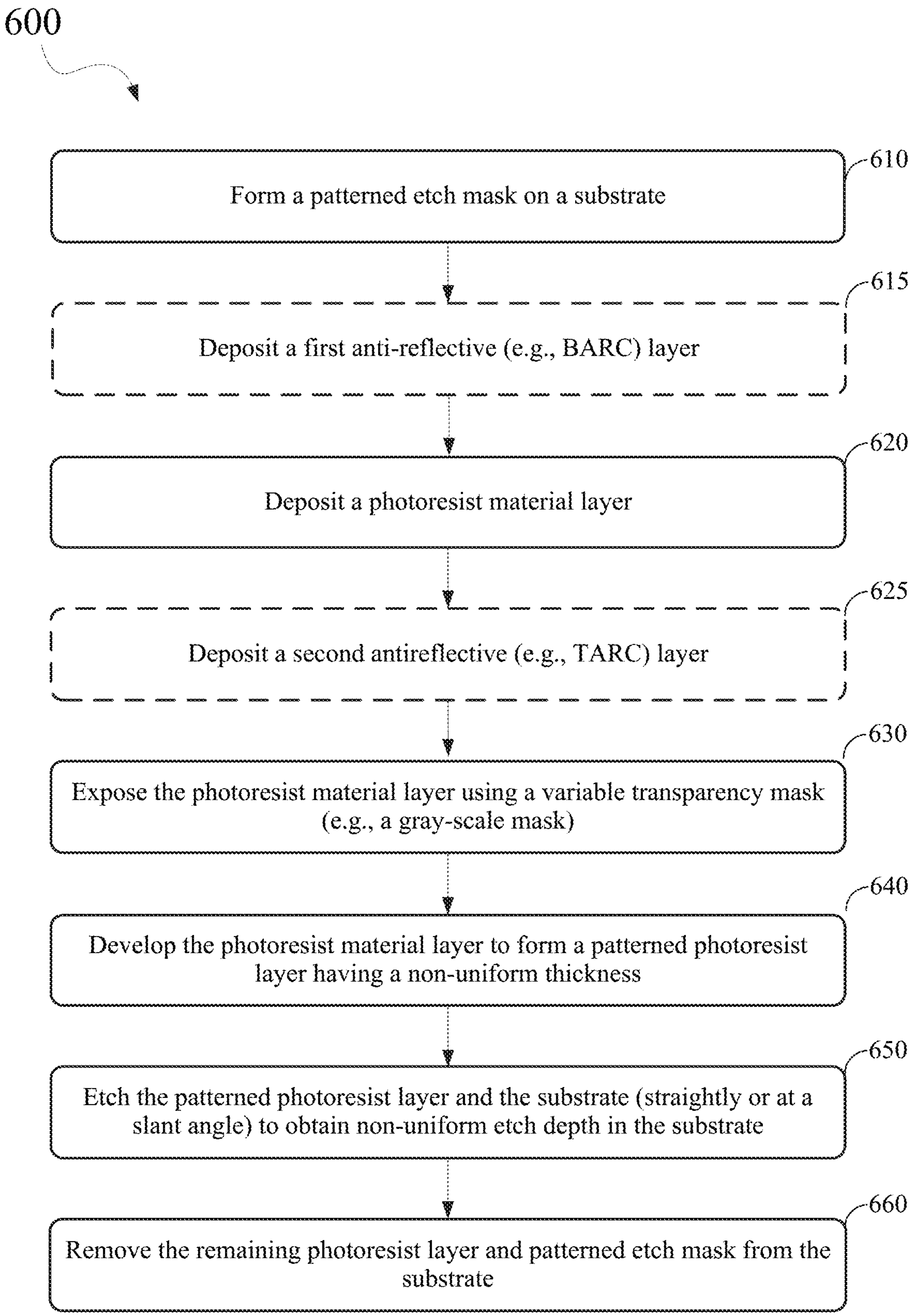
FIG. 6 includes a flowchart illustrating an example of a method of fabricating a variable-etch-depth grating using a gray-tone mask according to certain embodiments.

FIG. 6 is a flowchart 600 illustrating an example of a process of fabricating a variable-etch-depth grating according to certain embodiments. The operations described in flowchart 600 are for illustration purposes only and are not intended to be limiting. In various implementations, modifications may be made to flowchart 600 to add additional operations or to omit some operations. The operations described in flowchart 600 may be performed by, for example, one or more semiconductor fabrication systems that include a patterning system, a deposition system, an etching system, or any combination thereof.

At block 610, a patterned etch mask (e.g., a hard mask) may be formed on a substrate. The patterned etch mask may include a 2-D pattern (e.g., in a horizontal or x-y plane perpendicular to the surface-normal of the substrate) that matches the 2-D pattern of the grating to be manufactured. For example, the patterned etch mask may have the same grating periods and duty cycles as the grating periods and duty cycles of the grating to be manufactured. The patterned etch mask may have a very low etch rate, and, in some embodiments, may include a metal material, such as Cr. In some embodiments, the patterned etch mask may be formed by a lithography process. For example, an etch mask layer may be deposited on the substrate; a photoresist layer may be deposited on the etch mask layer and exposed to light through a photomask; the exposed photoresist layer may be developed to form the desired pattern in the photoresist layer; and an etching process may then be performed to transfer the desired pattern in the photoresist layer onto the etch mask layer. In some embodiments, the etch mask layer may be pre-manufactured and then laminated onto the substrate. In some embodiments, the patterned etch mask may be formed by a laser ablation, an electron beam lithography, an interference lithography, a multi-photon lithography, a scanning probe lithography, or some combinations thereof.

Optionally, at block 615, a deposition system may deposit an anti-reflective layer (e.g., a bottom anti-reflective coating (BARC) layer) on the patterned etch mask. The deposition may include, for example, spin coating, spray coating, physical vapor deposition, chemical vapor deposition, an atomic layer deposition, or the like. In some embodiments, the anti-reflective layer may include one or more dielectric layers that may cause destructive interferences between light reflected at different surfaces of the one or more dielectric layers to reduce the effective reflection of the anti-reflective layer. In some embodiments, alternatively or additionally, the anti-reflective layer may include an absorptive material that may absorb the light used for photolithography to attenuate the exposure light passing through the anti-reflective layer, thereby reducing the light reflection at the interface between the anti-reflective layer and the substrate (or the patterned etch mask). The anti-reflective layer may have an etch rate comparable to (e.g., similar to or slightly lower or greater than) the etch rate of the substrate, such as quartz, silicon, silicon nitride, and the like.

At block 620, a deposition system may deposit a photoresist material layer on the patterned etch mask. The deposition may include, for example, spin coating, spray coating, physical vapor deposition, chemical vapor deposition, an atomic layer deposition, or the like. The photoresist material layer may include a positive-tone photoresist material, which, upon exposure, may become more soluble in a photoresist developer, such that the exposed portions of the photoresist material layer may be removed by the development process. The photoresist material may also have a linear response to exposure dose such that the depth of an exposed portion of the photoresist material layer may correlate with the exposure dose at the exposed portion. The photoresist material may further be characterized by an etch rate comparable to (e.g., similar to or greater than) the etch rate of the substrate, such as quartz, silicon, silicon nitride, and the like. More details of suitable photoresist materials are described below.

Optionally, at block 625, a deposition system may deposit an anti-reflective layer (e.g., a top anti-reflective coating (TARC)) on the photoresist material layer. The deposition may include, for example, spin coating, spray coating, physical vapor deposition, chemical vapor deposition, an atomic layer deposition, or the like. In some embodiments, the TARC layer may include one or more dielectric layers that may cause destructive interferences between light reflected at different surfaces of the one or more dielectric layers to reduce the effective reflection of the anti-reflective layer. In some embodiments, the TARC layer may have an etch rate comparable to (e.g., similar to or slightly lower or greater than) the etch rate of photoresist material or the substrate, such as quartz, silicon, silicon nitride, and the like.

At block 630, the photoresist material layer may be exposed to ultra-violet (UV) light or deep UV light through a variable transparency photomask (e.g., a gray-scale photomask). The variable transparency photomask may be characterized by a transmissivity function correlated with the desired depth profile on the photoresist material layer or the desired depth profile of the grating (or nanoimprint mold) to be fabricated. For example, the variable transparency photomask may include multiple levels of light transmission rate or may include a continuously varying light transmission rate. In some embodiments, the variable transparency photomask may include a metal layer or another partially UV-blocking material layer having a varying thickness. Therefore, the variable transparency photomask may selectively transmit UV radiation of different intensity levels to modulate the dose of UV radiation on the photoresist material layer and thus the exposure depth of the photoresist material layer.

At block 640, the exposed photoresist material layer is developed using a photoresist developer (e.g., using aqueous alkaline) to remove (e.g., dissolve) the exposed portions from the photoresist material layer and form a patterned photoresist layer having a non-uniform thickness. The development process can include immersion development, puddle development, spray development, and the like. The photoresist developer may include, for example, a diluted sodium hydroxide or potassium hydroxide solution, an aqueous solution of metal-ion-free organic TetraMethylAmmoniumHydroxide (TMAH), or an organic solvent.

At block 650, the patterned photoresist layer and the substrate may be etched to transfer the thickness profile of the patterned photoresist layer into the substrate, thus achieving the non-uniform etch depth in the substrate. The etching may include straight etching or slanted etching. The etching may include, for example, a wet etching, an ion milling, a plasma based reactive ion etching, or some combinations thereof. The wet etching may include a chemical etching using a combination of acids, bases, and solvents at a range of temperatures and concentrations. The ion milling may include a physical removal of a portion of the patterned photoresist layer and the substrate at a low pressure and using a high accelerating potential such that electrons may be accelerated to impact gas atoms with enough energy to ionize the gas atoms. The plasma-based reactive ion etching (RIE) may use a chemically reactive plasma at a low pressure and an electromagnetic field to remove portions of the patterned photoresist layer and the substrate. In any of these etching techniques, the etch rate of the photoresist material may be similar to or greater than the etch rate of the substrate in order to transfer the thickness profile of the patterned photoresist layer to the substrate. For example, the etch rate of the patterned photoresist layer may be between about 0.5 to about 5 times of the etch rate of the substrate, between about 0.6 to about 3 times of the etch rate of the substrate, between about 0.7 to about 2 times of the etch rate of the substrate, between about 0.8 to about 1.5 times of the etch rate of the substrate, between about 0.9 to about 1.2 times of the etch rate of the substrate, and the like.

At block 660, the remaining photoresist (if any) and the patterned etch mask may be removed from the substrate using one or more solvents or other removers or strippers to expose the substrate that includes a grating structure with varying depth etched therein. The grating structure may be a final product of a variable-etch-depth grating or may be used as a master mold for imprinting variable-etch-depth gratings.

Figures 7A, 7B, 7C, 7D, 7E, 7F:
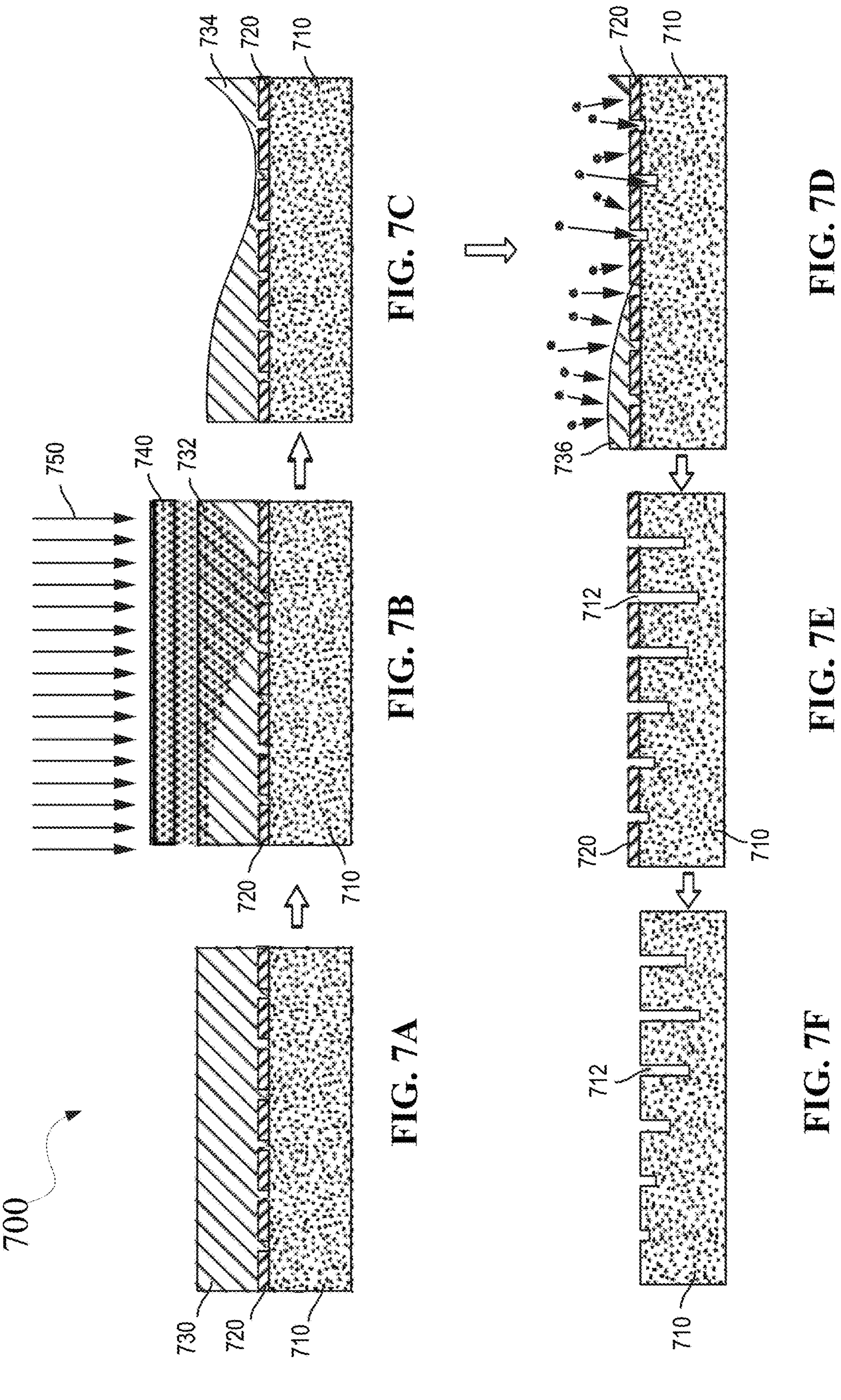
FIGS. 7A-7F illustrate an example of a process for fabricating a variable-etch-depth grating according to certain embodiments.

FIG. 7A-7F illustrate an example of a process 700 for fabricating a variable-etch-depth grating according to certain embodiments. Process 700 may be an example of the method described above with respect to FIG. 6. FIG. 7A shows a substrate 710 (e.g., including SiC or $Si_3N_4$) having a metal grating mask 720 (e.g., a hard mask, such as chromium-based metal grating mask) and a photoresist material layer 730 formed thereon. Metal grating mask 720 may include a uniform or nonuniform pattern. Photoresist material layer 730 may include a low contrast photoresist, and may be baked at a low temperature (e.g., about 100° C.) to remove the solvent after photoresist material layer 730 is deposited (e.g., spin-coated or spray-coated) on substrate 710 to form a film.

FIG. 7B shows that photoresist material layer 730 is exposed to UV light 750 through a gray-scale photomask 740. UV light 750 may have a wavelength shorter than 300 nm, such as between about 240 nm and 280 nm, at 193 nm, at 157 nm, or lower (e.g., at a deep UV wavelength).

Gray-scale photomask 740 may include a transparent substrate and a layer having a UV light transmissivity varying across its area. As illustrated, in areas of photoresist material layer 730 corresponding to areas of gray-scale photomask 740 that have higher transmissivity, the depth of the exposed portions 732 of photoresist material layer 730 may be higher.

FIG. 7C shows that photoresist material layer 730 exposed to UV light 750 through gray-scale photomask 740 may be developed to remove the exposed portions 732. After the development and removal of exposed portions 732, a patterned photoresist layer 734 may remain on metal grating mask 720. The thickness profile of patterned photoresist layer 734 may correspond to the desired depth profile of the surface-relief grating to be fabricated, and may also be a function of the etch rate of the photoresist and the etch rate of substrate 710.

FIG. 7D shows an ion etching process that etches portions of patterned photoresist layer 734 and, in some areas, also etches portions of substrate 710. High-energy ions may be used to bombard patterned photoresist layer 734 and substrate 710, to remove materials physically and/or chemically. The etch depth of substrate 710 is the highest in areas of substrate 710 that correspond to areas of patterned photoresist layer 734 with the lowest thickness. As described above and below, the etching can be straight etching or slanted etching.

FIG. 7E shows that patterned photoresist layer 734 may have been completely etched or the remaining portion 736 of patterned photoresist layer 734 may have been removed by a remover (e.g., a solvent) or a stripper. As illustrated in FIG. 7E, the depths of the grating grooves of a grating 712 formed in substrate 710 may be different in different areas of substrate 710.

FIG. 7F shows that metal grating mask 720 has been removed to expose grating 712 in substrate 710. In some embodiments, an overcoat layer having a refractive index different from the refractive index of substrate 710 may be coated on grating 712 to protect grating 712. In some embodiments, an antireflective coating may be formed on the grating 712 and the overcoat layer.

Figure 8:
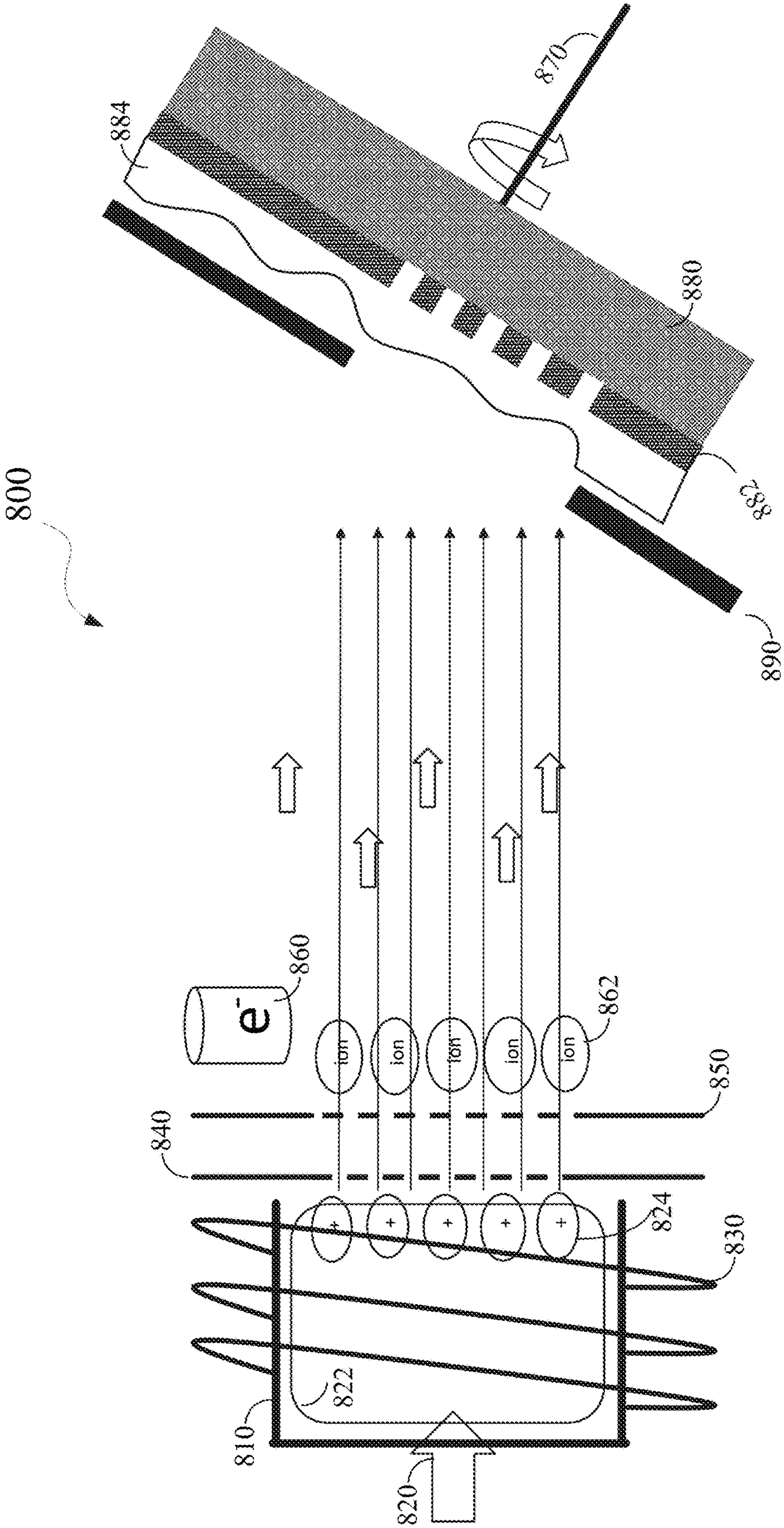
FIG. 8 illustrates an example of an ion beam etching system for fabricating a slanted variable-etch-depth surface-relief grating according to certain embodiments.

FIG. 8 illustrates an example of an ion beam etching system 800 for fabricating a slanted surface-relief grating according to certain embodiments. Ion beam etching (IBE) generally uses a highly collimated and highly directional ion beam to physically mill materials from a substrate mounted on a rotation stage having an adjustable rotation angle. IBE system 800 may include an ion source generator 810. Ion source generator 810 may include an inert gas inlet 820 for receiving an inert gas, such as an Argon gas, into a chamber of ion source generator 810. A plasma may be generated in ion source generator 810 via an RF inductively coupled plasma (ICP) generator 830, where highly energetic electrons may ionize neutrals of the injected inert gas (e.g., Ar) through collisions with the neutrals. A high density plasma 822 may be generated within ion source generator 810 by the impact ionization. High density plasma 822 may be considered as a sea of neutrals with positive ions 824 and negative electrons in charge equilibrium.

IBE system 800 may also include one or more aligned collimator grids for extracting a collimated ion beam 862 from high density plasma 822 formed within ion source generator 810. The aligned collimator grids may be implemented in various ways. For example, as shown in FIG. 8, the aligned collimator grids may include an extraction grid 840 that may contact high density plasma 822 and control its potential, and an acceleration grid 850 that may be driven by an adjustable negative high voltage supply for accelerating the extracted ions. A beam neutralizer 860 may be disposed near the aligned collimator grids and may emit an electron beam into collimated ion beam 862 to achieve a net neutral charge flux associated with collimated ion beam 862 in order to prevent the buildup of positive charges on the structure to be etched.

The highly directional collimated ion beam 862 may physically mill materials from a gray-scale photoresist layer 884 having a variable thickness and from a substrate 880 to be etched, such as, for example, a semiconductor wafer, a glass substrate, a $Si_3N_4$ material layer, a SiC layer, a titanium oxide layer, an alumina layer, etc. Substrate 880 may be partially covered by a mask 882, which may be formed on substrate 880 by, for example, a photolithography process. Mask 882 may include, for example, a photoresist material, a metal (e.g., copper, chrome, aluminum, or molybdenum), an intermetallic compound (e.g., $MoSi_2$), or a polymer. Gray-scale photoresist layer 884 may be on top of mask 882, and may have a variable thickness achieved by exposing to UV light through a gray-scale mask and developing the photoresist as described above. In some embodiments, a shutter 890 (or blade) may be used to control the etch region, and the etch time and/or etch angles for different etch regions. Substrate 880 may be mounted on a rotation stage 870 that can be rotated to modify the angle of substrate 880 with respect to the highly directional collimated ion beam 862. The ability to modify the angle of substrate 880 may allow for the creation of tailored sidewall profiles with minimal sputtered redeposition on mask 882.

In some embodiments, IBE system 800 may include a chemically assisted ion beam etching (CAIBE) system for fabricating a slanted variable-etch-depth surface-relief structure. In the chemically assisted ion beam etching, reactive species, such as a reactive gas (e.g., $CF_4$, $CHF_3$, $N_2$, $O_2$, $SF_6$, $Cl_2$, $BCl_3$, HBr, etc.) may be introduced into the process independent of the ion beam, for example, injected through a gas ring (not shown in FIG. 8) at a location close to substrate. Thus, the substrate and the photoresist layer to be etched may be etched both physically and chemically.

In some embodiments, IBE system 800 may include a reactive ion beam etching (RIBE) system for fabricating a slanted variable-etch-depth surface-relief structure. The reactive ion beam etching system may inject a reactive gas (e.g., $CF_4$, $CHF_3$, $N_2$, $O_2$, $SF_6$, etc.) into the ion source generator to form a reactive ion beam that can both physically and chemically etch the material layer to be etched.

In some etching processes, such as some RIE or IBE etching processes, the etch rate and thus the depth of the grating may depend on the duty cycle of the grating to be etched. As such, the etch depths may depend on other physical dimensions (e.g., the duty cycle or period) of the grating. For example, for a deep straight or slanted grating with a small duty cycle or a large grating period, the grating grooves may be relatively wide or may have a lower aspect ratio (depth divided by width), and thus the residues from the etching may be relatively easy to remove and the etch rate may be higher. However, for a deep grating with a large duty cycle or a small period where the grating grooves may have higher aspect ratios, even if the grating may be a straight grating, the residues of the etching may be relatively difficult to remove from the etched regions, and thus the etch rate may be lower. In addition, depletion of ions may occur when ions are captured by the sidewalls due to the angular distribution of incoming ions into the trench opening and the electrostatic fields in the trench, which may also reduce the etch rate. Thus, under a same etching condition (e.g., same ion beam dosage and etch time), regions of the grating having a smaller duty cycle may be etched faster and deeper than regions of the grating having a larger duty cycle. As such, for nanostructures with trenches of different dimensions and/or aspect ratios coexisting on a same substrate, the etched depths after a same etching process may be different for regions with different duty cycles.

Figure 9A:
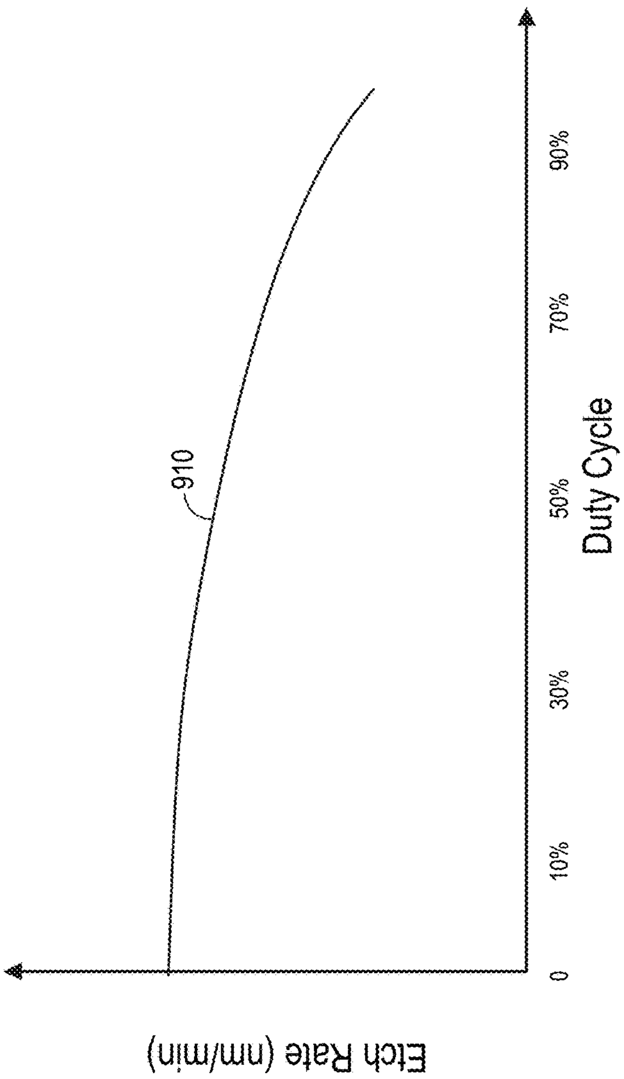
FIG. 9A illustrates an example of a reactive ion etching (RIE) or ion beam etching (IBE) lag curve that represents the relationship between duty cycles and etch rates using RIE/IBE.

FIG. 9A illustrates an example of an RIE/IBE lag curve 910, which represents the relationship between the grating duty cycle and the etch rate using RIE/IBE. In FIG. 9A, the horizontal axis represents the duty cycle, which may range from 0% to 100%. For a structure having ridges and trenches, the duty cycle refers to the ratio between the width of a ridge and the combined width of the ridge and the adjacent trench (i.e., a period). The vertical axis represents the relative etch rate that can be achieved for each respective duty cycle using a same process. It should be noted that RIE/IBE lag curve 910 shown in FIG. 9A is for illustration purposes only and may only illustrate a general trend. Depending on the materials to be etched, the etch system used, the etchants used, and/or the etching conditions, the actual RIE/IBE lag curve may vary from one etching condition to another etching condition, and may also change as the grating depth increases during the etching.

As shown in FIG. 9A, as the duty cycle increases (i.e., the width of the ridge increases and/or the width of the trench decreases), the etch rate may gradually decrease, and thus the etch depth that can be achieved by an RIE/IBE process after a given etch duration may gradually decrease. This effect may be because the ion mean free path is shorter inside small trenches even if there may be abundant ions for the etch reaction to occur regardless of the duty cycle, where the shorter ion mean free path may lower the effectiveness of the etching. Also, the etching by-products may not be efficiently transported out of the etched trenches when the duty cycle is relatively large. The lag in the by-product transportation to the trench opening may result in a lower etch depth when the duty cycle is larger.

In the example shown in FIG. 9A, when the duty cycle changes from, for example, below about 40% to about 90% or higher, the etch rate may reduce significantly. It should be noted that although FIG. 9A illustrates that when the duty cycle is about 40% or below, the effect of duty cycle on the etch rate may be relatively small in some embodiments, in some other embodiments, the effect of duty cycle on the etch rate may still be significant even when the duty cycle is below 40% or below 30%, because the etch rate also depends on other grating parameters, such as the grating pitch or period. For example, for gratings having a same duty cycle but different grating periods, a grating having a larger period may have a wider trench, which may lead to a deeper etched trench. Thus, for different grating periods, the RIE/IBE lag curve may start to drop at a duty cycle different from that shown in FIG. 9A. The etch rate may also drop as the etch depth becomes higher.

Figure 9B:
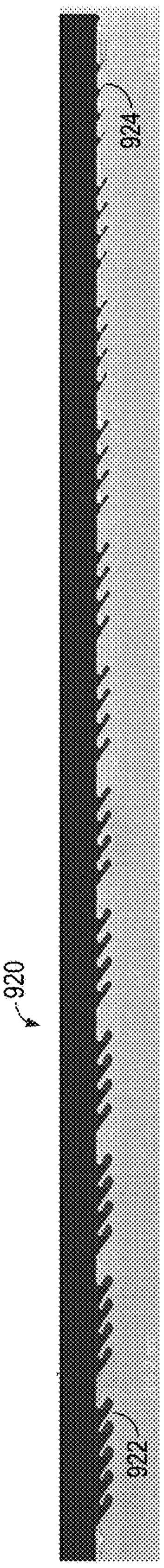
FIG. 9B illustrates an example of a slanted grating fabricated using an etching process.

FIG. 9B illustrates an example of a slanted grating 920 fabricated using an etching process. In the illustrated example, in section 922 of slanted grating 920, the grating duty cycle may be smaller and thus the grating grooves may be wider. Therefore, the etch depth in slanted grating 920 may be higher in section 922, such as about 200 nm as shown in the example. In contrast, in section 924 where the grating duty cycle may be larger and thus the grating grooves may be narrower, the etch depth in slanted grating 920 may be lower, such as about 75 nm as shown in FIG. 9B.

In some embodiments, gray-tone photoresists may be used to tune the etch depth for gratings with different duty cycles, based on the RIE/IBE lag curve of the etching. For example, at regions with a smaller duty cycle and a wider groove (and thus a higher etch rate), the gray-tone photoresist may be thicker such that more gray-tone photoresist materials may need to etched before the underlying substrate is etched. At regions with a larger duty cycle and a narrower groove (and thus a lower etch rate), the gray-tone photoresist may be thinner. As such, similar etch depths may be achieved at regions of the grating with different duty cycles. Gray-tone photoresist may also be used to protect areas that do not need to be etched.

Figure 10:
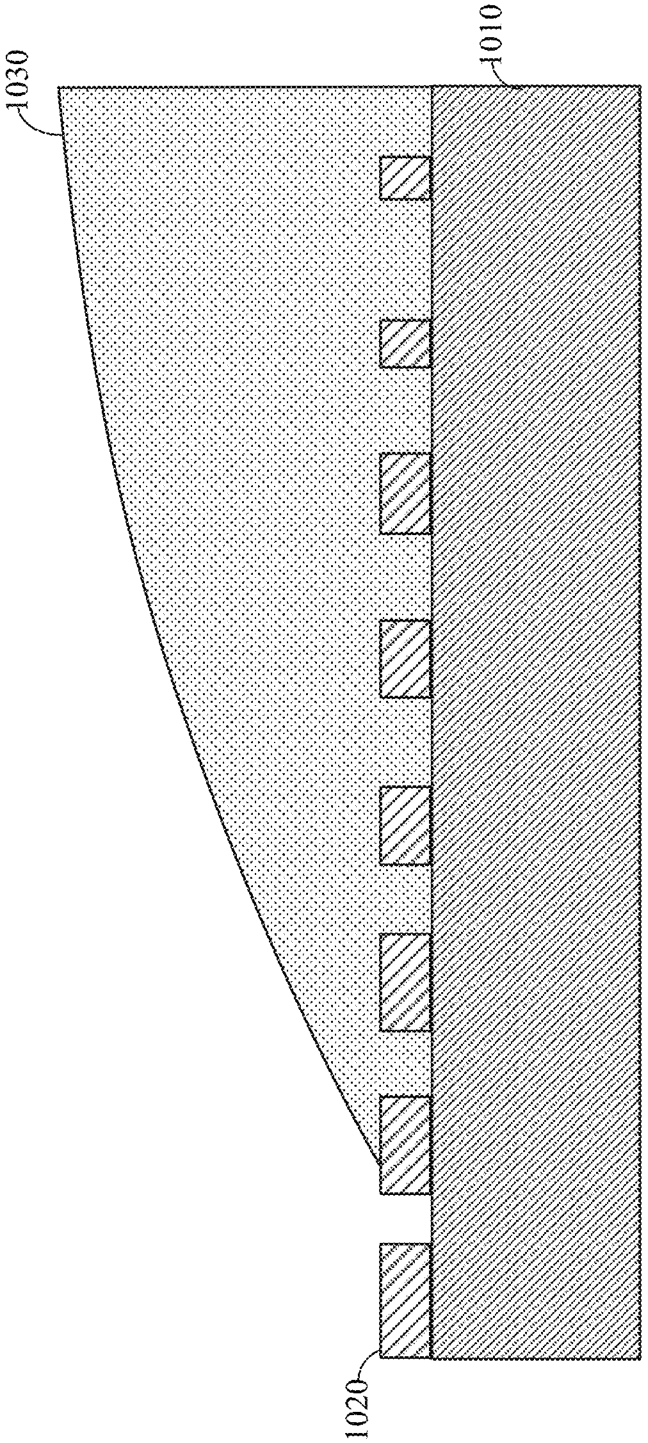
FIG. 10 illustrates an example of a method of tuning etch depths using a gray-tone photoresist according to certain embodiments.

FIG. 10 illustrates an example of a method of tuning etch depth using gray-tone photoresists according to certain embodiments. FIG. 10 shows a substrate 1010 (e.g., a SiC or $Si_3N_4$ substrate in which a grating is to be etched), and a patterned hard mask 1020 formed on substrate 1010. In the illustrated example, the duty cycle of the pattern in patterned hard mask 1020 may be different at different regions. Thus, if an etching process is performed directly using patterned hard mask 1020, different regions of substrate 1010 may have different etch depths due to the etch lag described above with respect to FIGS. 9A and 9B. For example, regions with larger duty cycles (e.g., the left regions) and narrower grating grooves may have lower etch rates and thus may have lower etch depths under the same etching condition, compared with regions with smaller duty cycles (e.g., the right regions). To achieve a uniform etch depth, a gray-tone photoresist layer 1030 may be formed on patterned hard mask 1020 using techniques disclosed herein. In regions with smaller duty cycles and thus higher etch rates, the thickness of gray-tone photoresist layer 1030 may be higher such that more photoresist material may need to be etched before substrate 1010 is etched. In regions with larger duty cycles and thus lower etch rates, the thickness of gray-tone photoresist layer 1030 may be lower such that less photoresist material may need to be etched before substrate 1010 is etched. In this way, under the same etching condition, different regions of substrate 1010 may have similar etch depths after a certain etch period. The gray-tone photoresist may also be used to achieve other desired thickness profiles for gratings with different duty cycles, for example, by tuning the thickness profile of the gray-tone photoresist based on the duty cycles, the corresponding etch rates, and the desired etch depths at different regions of the grating.

In some dry etching systems (e.g., some IBE or RIE etching systems), during the etch, the surface of the gray-tone photoresist may become rough due to, for example, the high temperature condition in the etching chamber and the high-energy ion bombardments during etching. The high temperature etching condition and the ion bombardment may degrade and soften the gray-tone photoresists such that the gray-tone photoresists may become flowable. The slanted high-energy ion bombardment may create ripples on surfaces of the flowable gray-tone photoresists. The resultant photoresist layer after the etching may appear hazy due to light scattering caused by the surface roughness.

Figure 11:
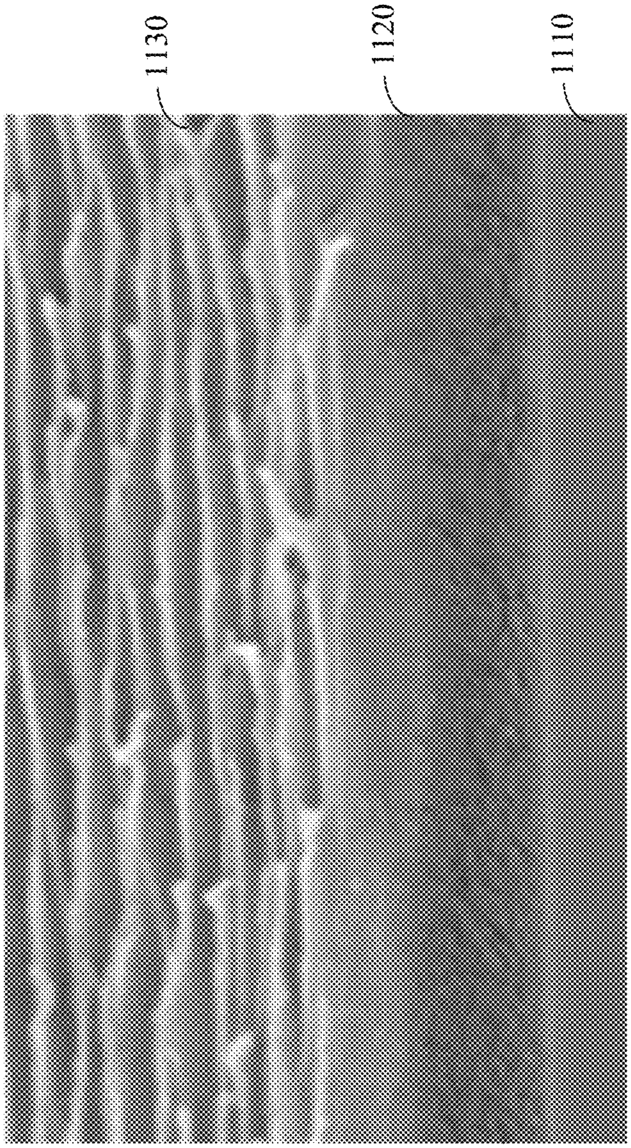
FIG. 11 illustrates an example of surface-roughness on a photoresist layer after ion beam etching.

FIG. 11 illustrates an example of surface-roughness on a photoresist layer 1120 after ion beam etching. In the illustrated example, photoresist layer 1120 and a substrate 1110 may be etched using ion beam etching. During and after the ion beam etching, photoresist layer 1120, which may include a novolac i-line resin, may have ripples 1130, for example, about 700 nm high and about 3 μm wide. If photoresist layer 1120 is used as the etch mask in subsequent etching, the surface roughness of photoresist layer 1120 may result in gratings with undesired or uncontrolled etch depth. For example, some surface-relief gratings may have desired grating groove depths about a few hundred nanometers, and the large ripples in photoresist layer 1120 may cause significant changes (e.g., at a large percentage) to the depths of the etched grating grooves, even if the etch rate of the underlying substrate 1110 may be much lower than the etch rate of photoresist layer 1120.

According to certain embodiments, a thermally crosslinkable photoresist having a non-binary linear or nonlinear response to exposure dosage (and thus can be used to record images) may be used as the gray-tone photoresist. After exposure to UV light through a gray-tone photomask and the develop of the gray-tone photoresist, a hard bake process may be performed to crosslink and harden the remaining photoresist and/or increase the glass-transition temperature $T_g$ of the resultant photoresist, such that the resultant photoresist may not become flowable to form ripples during the etch.

In some embodiments, the thermally crosslinkable photoresist may be formed by mixing a phenolic polymer such as novolac i-line resin (e.g., a phenolic novolac resin), and a dissolution inhibitor/photosensitizer such as diazonaphthoquinone (DNQ) or other diazoquinones (DQ). When the thermally crosslinkable photoresist is exposed to light, DNQ may act as a dissolution inhibitor so that the photoresist is insoluble in an aqueous base developer. In some embodiments, the thermally crosslinkable photoresist may also include an organic casting solvent. The novolac resin may provide certain physical properties such as good film-forming characteristics, etch resistance, and thermal stability. In one example, the novolac resin may include ma-P 1200G series from micro resist technology GmbH. In some embodiment, the novolac resin may include copolymers such as poly(styrene-co-glycidyl methacrylate). The DNQ dissolution inhibitor/photosensitizer may make it possible to image the photoresist by providing a photochemical route to modifying the dissolution rate of the photoresist in, for example, aqueous alkaline developers. The organic solvent may make it possible to spin-coat the photoresist to form uniform, glassy thin films. The organic solvent may include, for example, cyclohexanone, acetone, ethyl lactate, 1-methyl-2-pyrrolidinone (NMP), diglyme (diethyleneglycol dimethyl ether), butyl acetate, and propyleneglycol methyl ether acetate (PGMEA).

The thermally crosslinkable photoresist may include one or more crosslinking agents (e.g., aromatic crosslinking agents) that can lower the crosslinking temperature of the thermally crosslinkable photoresist, such that the thermally crosslinkable photoresist can be crosslinked below degradation temperature. For example, in some embodiments, the thermally crosslinkable photoresist may include novolac resins with molecular weights between about 1 k and about 100 k (e.g., between about 2 k and about 50 k, such as about 10 k), a DNQ compound, and zero to three crosslinking agents (e.g., no crosslinking agent, one crosslinking agent, or a blend of two or three crosslinking agents) at about 0.1-20 wt %.

According to some embodiments, a method for fabricating a surface-relief grating may include forming a patterned etch mask on a substrate; depositing, on the patterned etch mask, a photoresist material layer that has a non-binary response to exposure dosage and is thermally crosslinkable; exposing the photoresist material layer to exposure light through a gray-scale photomask; developing the exposed photoresist material layer to form a patterned photoresist layer having a non-uniform thickness; baking the patterned photoresist layer at an elevated temperature to crosslink the patterned photoresist layer; and etching the patterned photoresist layer and the substrate to form a surface-relief grating having a uniform or non-uniform etch depth in the substrate. The method may also include removing the patterned photoresist layer and the patterned etch mask from the substrate after the etching to expose the surface-relief grating, and forming an overcoating layer and/or an antireflective coating layer on the surface-relief grating.

Figures 12A, 12B, 12C, 12D, 12E:
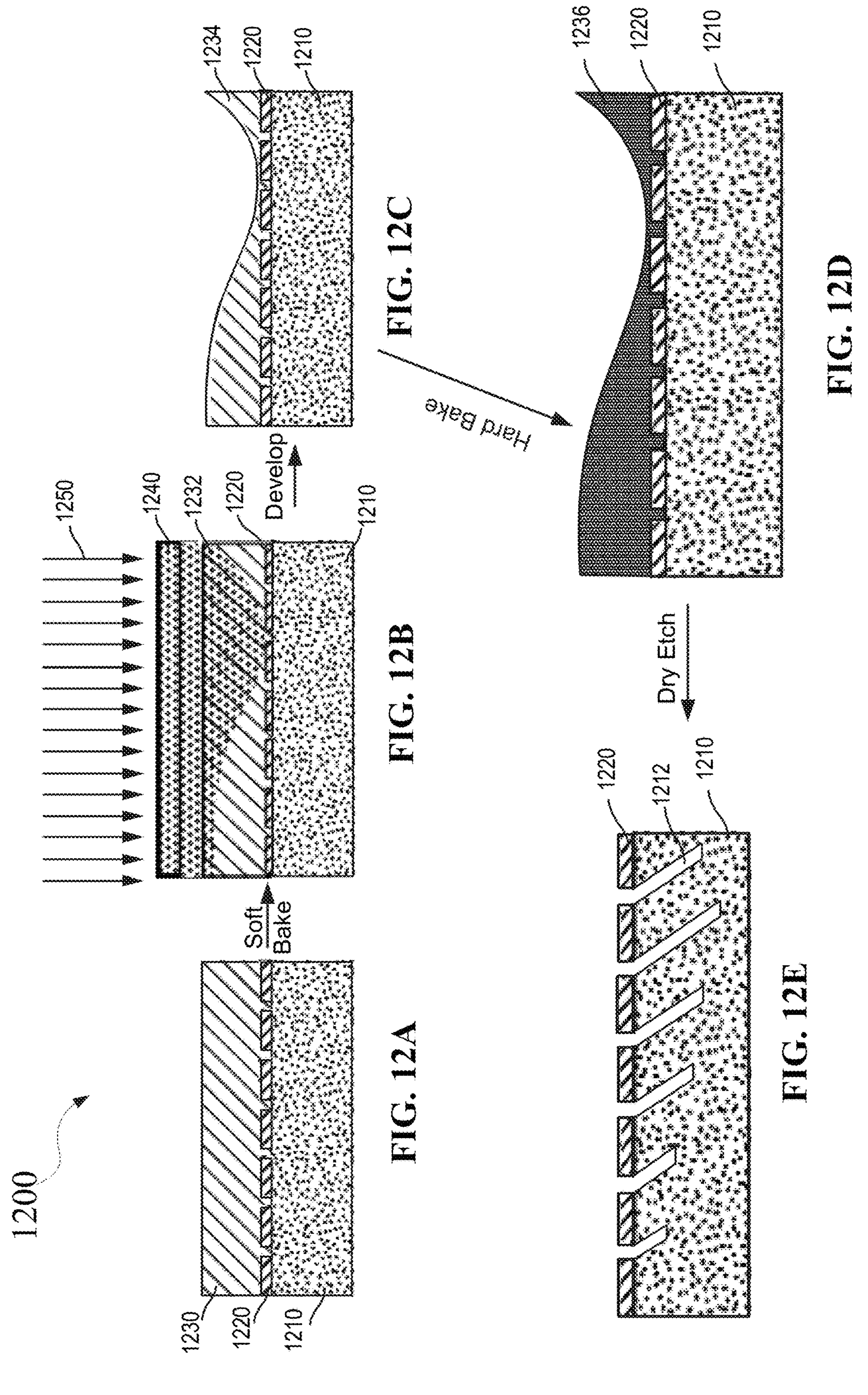
FIGS. 12A-12E illustrate an example of a process for fabricating a variable-etch-depth grating according to certain embodiments.

FIGS. 12A-12E illustrate an example of a process 1200 for fabricating a variable-etch-depth grating according to certain embodiments. As shown in FIG. 12A, the process may include forming a patterned etch mask 1220 (e.g., a grating mask including a metal such as Cr) on a substrate 1210, and depositing (e.g., spin coating or spray coating), on the patterned etch mask, a photoresist material layer 1230 that has a non-binary response to exposure dosage and is thermally crosslinkable. Photoresist material layer 1230 may include crosslinkable photoresists disclosed herein, which may include, for example, novolac i-line resins, a solvent, and one or more crosslinking agents (e.g., aromatic) that may lower the crosslinking temperature of the crosslinkable photoresist, such that the crosslinkable photoresist may crosslink at a temperature below the degradation temperature (e.g., the glass-transition temperature $T_g$) of the photoresists without the crosslinking agents. The crosslinking may increase the density, the hardness, and the glass transition temperature of the photoresist, and may lower the etch rate of the photoresist. Photoresist material layer 1230 may be baked at a low temperature (e.g., about 95° C. to about 100° C.) to remove the solvent (e.g., PGMEA).

FIG. 12B shows that photoresist material layer 1230 may be exposed to UV light 1250 through a gray-scale photomask 1240. UV light 1250 may have a uniform intensity profile and may have a wavelength shorter than 300 nm, such as between about 240 nm and 280 nm, at 193 nm, at 157 nm, or lower (e.g., at a deep UV wavelength). Gray-scale photomask 1240 may include a transparent substrate and a layer having a UV light transmissivity varying across its area, such that different areas of photoresist material layer 1230 may be exposed to UV light of different doses. As illustrated, in areas of photoresist material layer 1230 corresponding to areas of gray-scale photomask 1240 that have higher transmissivity, the exposure dosage may be high and thus the depth of the exposed portions 1232 of photoresist material layer 1230 may be higher.

FIG. 12C shows that photoresist material layer 1230 exposed to UV light 1250 through gray-scale photomask 1240 may be developed using, for example, a diluted sodium hydroxide or potassium hydroxide solution, an aqueous solution of metal-ion-free organic TetraMethylAmmoniumHydroxide (TMAH), or an organic solvent, to remove the exposed portions 1232. After the development and removal of exposed portions 1232, a patterned photoresist layer 1234 may remain on patterned etch mask 1220. The thickness profile of patterned photoresist layer 1234 may correspond to the desired depth profile of the surface-relief grating to be fabricated, and may also be a function of the etch rate of the photoresist and the etch rate of substrate 1210.

FIG. 12D shows that patterned photoresist layer 1234 may be baked at an elevated temperature (e.g., greater than about 100° C., such as at or below about 250° C. or at or below about 200° C.) to crosslink and harden patterned photoresist layer 1234, such that patterned photoresist layer 1234 may become a crosslinked photoresist layer 1236. Crosslinked photoresist layer 1236 may have a higher density, and a higher hardness, and a higher glass transition temperature.

FIG. 12E shows that crosslinked photoresist layer 1236 and substrate 1210 may be etched in a dry etching process, for example, using ion beam etching system 800, to form a slanted, variable-depth, surface-relief grating 1212 in substrate 1210, as described above with respect to, for example, FIGS. 7D and 7E. In the dry etching process, high-energy ions may be used to bombard crosslinked photoresist layer 1236 and substrate 1210, to remove materials physically and/or chemically. The depth of the grooves of surface-relief grating 1212 may be the highest in areas of substrate 1210 that correspond to areas of crosslinked photoresist layer 1236 with the lowest thickness. As described above and below, the etching can be straight etching or slanted etching. After the etching, the remaining portion of crosslinked photoresist layer 1236 may be removed by a remover (e.g., a solvent) or a stripper. Patterned etch mask 1220 may also be removed to expose surface-relief grating 1212. In some embodiments, an overcoating layer and/or an antireflective coating layer may be formed on surface-relief grating 1212.

The crosslinking agents used in the thermally crosslinkable photoresist may include, for example, one or more crosslinking function groups attached to aromatic compounds or heterocyclic compounds, such as five-member heterocyclic compounds, six-member heterocyclic compounds, aromatic compounds having one, two, three, or four heterocyclic compounds, or a combination thereof. The aromatic compounds or heterocyclic compounds may provide etch resistance to the overall formulation so that the etch resistance of the overall formulation may not decrease. The crosslinking function groups may include, for example, alkoxy groups, methoxy groups, epoxy groups, hydroxyl groups, or a combination thereof.

In some embodiments, one of the crosslinking agents may include crosslinking function groups attached to two imidazole rings. For example, the crosslinking agent may have the structure for Formula (I):

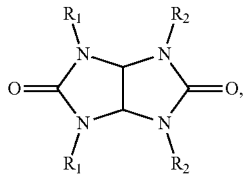

(I)

where R1 group and R2 group are each independently hydrogen, hydroxyl, aliphatic, alkoxy, oxirane, substituted or unsubstituted alkyl, branched alkenyl, carbonyl, cycloalkyl, dicabonyl, imino, oxo, or oxy. Examples of alkoxy groups include, but are not limited to, methoxy, methoxy, ethoxy, and butoxy. Each of R1 group and R2 group may also independently be any one or more of the following structures of Table 1:

TABLE 1

| R Groups | |
|---|---|
| 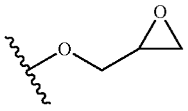 [SMILES: *OCC1CO1] | (A) |
| 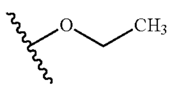 [SMILES: *OCC] | (B) |

TABLE 1-continued

| R Groups | |
|---|---|
| 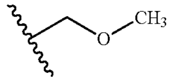 [SMILES: *COC] | (C) |
| 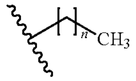 | (D) |
| 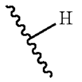 | (E) |
| 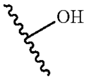 [SMILES: *O] | (F) |
| 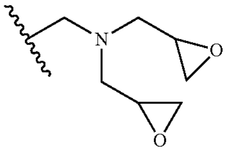 [SMILES: *CN(CC1CO1)CC1CO1] | (G) |

Examples of crosslinking agents that include crosslinking function groups attached to two imidazole rings may include:

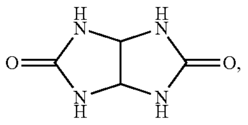

tetrahydroimidazo[4,5-*d*]imidazole-2,5(1*H*,3*H*)-dione,

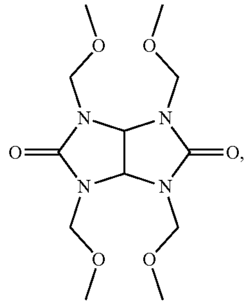

1,3,4,6-tetrakis(methoxymethyl)tetrahydroimidazo[4,5-*d*]imidazole-2,5(1*H*,3*H*)-dione,

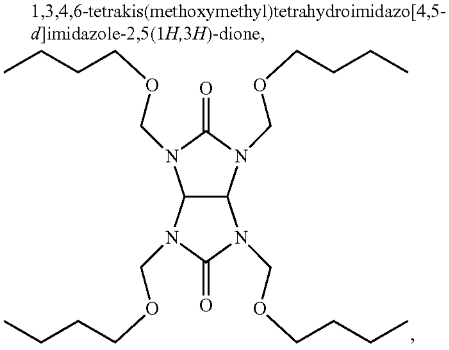

, or

-continued

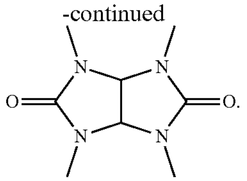

1,3,4,6-tetramethyltetrahydromidazo[4,5-*d*]imidazole-2,5(1*H*,3*H*)-dione

In some embodiments, the crosslinking agent may have the structure of Formula (II):

(II)

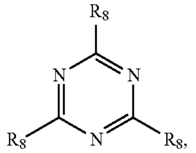

where each group may independently include a different oxygen-containing and/or nitrogen-containing group, such as an amino group. Each R8 group may independently be any one or more of the structures of Table 1.

In some embodiments, each R8 group of the crosslinking agent of Formula (II) may include a nitrogen having two R groups, such as having the structure of Formula (III):

(III)

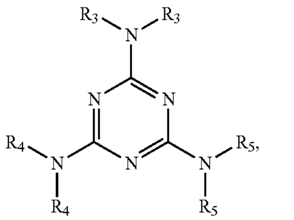

where each of R3, R4, and R5 may be hydrogen, hydroxyl, aliphatic, alkoxy, oxirane, substituted or unsubstituted alkyl, branched alkenyl, carbonyl, cycloalkyl, dicabonyl, imino, oxo, or oxy. Example of alkoxy groups include, but are not limited to, methoxy, methoxy, ethoxy, and butoxy. Each R3, R4, or R5 group may independently be any one or more of the structures of Table 1. An example of the crosslinking agent structure may be:

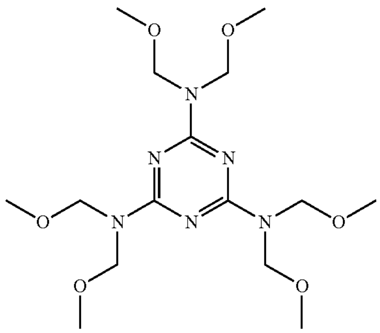

*N*[2],*N*[2],*N*[4],*N*[4],*N*[6],*N*[6]-hexakis(methoxymethyl)-1,3,5-triazine-2,4,6-triamine.

In some embodiments, the crosslinking agent may include crosslinking function groups attached to a benzene ring having a first substituent and two substituents both meta to the first substituent. In some embodiments, the substituents are the same. An example structure is shown in Formula (IV):

(IV)

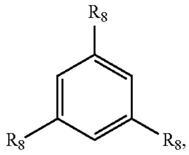

where each R8 group may independently include a different oxygen-containing and/or nitrogen-containing group, such as an amino group. Each R8 group may independently be any one or more of the structures of Table 1. An example of crosslinking agents having a benzene ring may be:

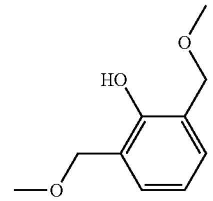

2,6-bis(methoxymethyl)phenol.

In some embodiments, the crosslinking agent may include crosslinking function groups attached to one or more benzene rings chained to another benzene ring by a $CH_2$ group, which may have the structure of Formula (V):

(V)

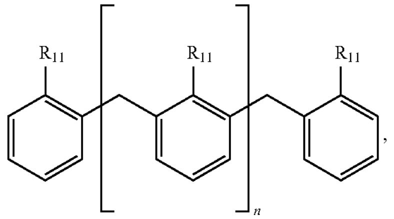

where n is an integer equal to or greater than 1, and R11 is hydrogen, hydroxyl, aliphatic, alkoxy, oxirane, substituted or unsubstituted alkyl, branched alkenyl, carbonyl, cycloalkyl, dicabonyl, imino, oxo, or oxy. Each R11 group may independently be any one or more of the structures of Table 1. In one example, the crosslinking agent may be:

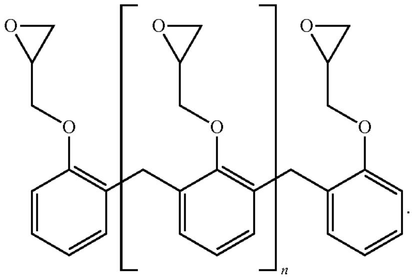

In some embodiments, the crosslinking agent may include crosslinking function groups attached to at least one benzene ring with a first substituent and two substituents each ortho to the first substituent. The crosslinking agent may include one benzene ring, two benzene rings connected by a $CH_2$ group, three benzene rings all connected to a carbon center, or four benzene rings in some embodiments. In one example, the crosslinking agent may have the structure of Formula (VI) or (VII):

(VI)

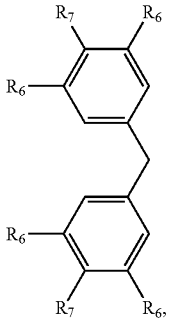

(VII)

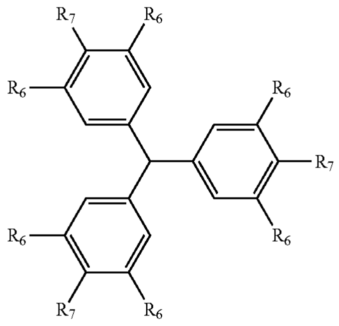

where each of R6 group and R7 group may independently be hydrogen, hydroxyl, aliphatic, alkoxy, oxirane, substituted or unsubstituted alkyl, branched alkenyl, carbonyl, cycloalkyl, dicabonyl, imino, oxo, or oxy. Each of R6 group and R7 group may independently be any one or more of the structures of Table 1. Examples of the the crosslinking agent may include:

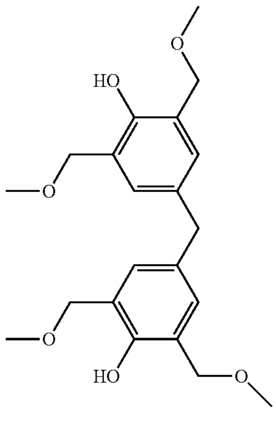

4,4'methylenebis(2,6-bis(methoxymethyl)phenol)

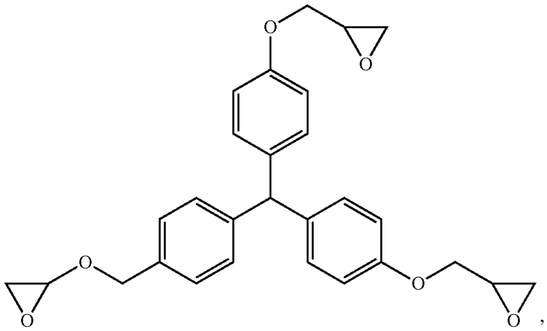

,

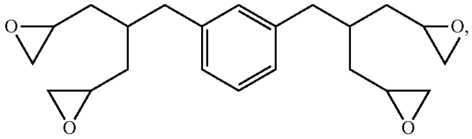

and

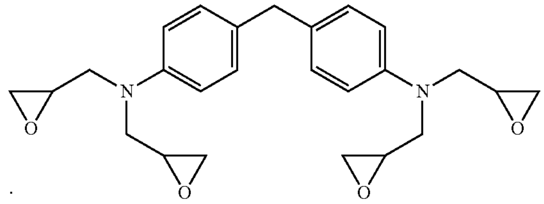

.

Figure 13:
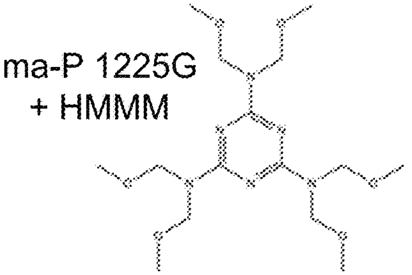
FIG. 13 includes a table illustrating experimental results of baking different photoresist materials under different conditions.
Figure 13:
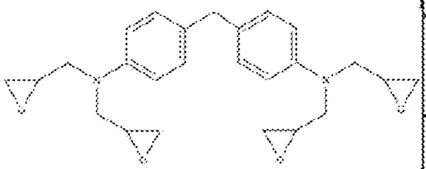

FIG. 13 includes a table 1300 illustrating experimental results of baking different photoresist materials under different conditions. In the experiments, each photoresist material is coated on a substrate and baked under a baking condition, and is then stripped to remove the photoresist material that has not been crosslinked. The remaining photoresist material on the substrate (the crosslinked photoresist) is measured (reported as a percentage of the amount of photoresist material coated on the substrate). FIG. 13 shows the experimental results for three different photoresist materials, each being baked at three different baking conditions having different bake temperatures and/or different bake times. The three different photoresist materials include ma-P 1225G (from micro resist technology GmbH) with no crosslinking agents, ma-P 1225G with a crosslinking agent hexa (methoxymethyl)melamine (HMMM), and ma-P 1225G with a crosslinking agent 3-methylbutane-1,3-diyl diacrylate (MBDA). The extent of the crosslinking of each photoresist under each baking condition is measured and shown in FIG. 13.

For ma-P 1225G photoresist with no crosslinking agent added, baking at about 100° C. for about 1.5 minutes may not cause any crosslinking, baking at about 100° C. for about 1.5 minutes and then baking at about 200° C. for about 3 minutes may cause about 60% of the photoresist material to crosslink, while baking at about 100° C. for about 1.5 minutes and then baking at about 250° C. for about 3 minutes may cause about 100% of the photoresist material to crosslink. When a crosslinking agent (e.g., HMMM or MBDA) is added to the photoresist, baking at about 100° C. for about 1.5 minutes may not cause any photoresist material to crosslink, but baking at about 100° C. for about 1.5 minutes and then baking at about 200° C. or higher for about 3 minutes may cause about 100% of the photoresist material to crosslink.

The experimental results show that, for the photoresists with crosslinking agents, baking at a temperature above 100° C., such as at or below about 200° C., may completely crosslink the photoresist, whereas baking the photoresists with no crosslinking agents at about 200° C. may only crosslink a portion of the photoresist. Therefore, the crosslinking agents may help to reduce the bake temperature needed for crosslinking or may help to increase the extent of crosslinking under low temperature baking conditions. Crosslinking the photoresist may densify and harden the photoresist, increase the glass transition temperature of the photoresist, and reduce the etch rate of the photoresist. Experimental results show that etching the crosslinked photoresist may result in smooth surfaces with roughness in a range of a few nanometers to a few tens of nanometers.

Figure 14:
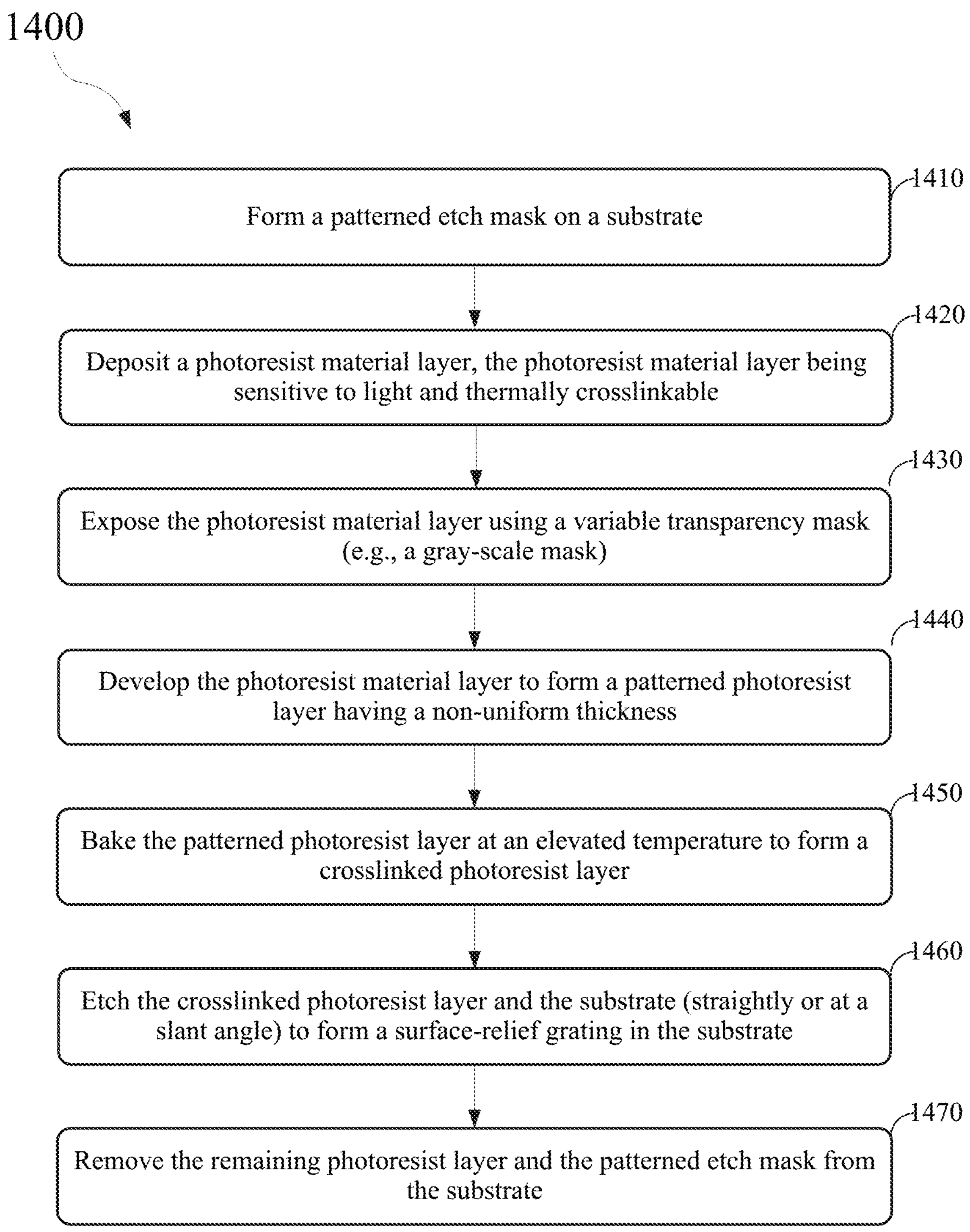
FIG. 14 includes a flowchart illustrating an example of a method of fabricating a surface-relief grating according to certain embodiments.

FIG. 14 is a flowchart 1400 illustrating an example of a process of fabricating a surface-relief grating according to certain embodiments. The process may be used to fabricate surface-relief gratings with straight or slanted grating ridges, uniform or variable etch depths, and uniform or variable duty cycles. The operations described in flowchart 1400 are for illustration purposes only and are not intended to be limiting. In various implementations, modifications may be made to flowchart 1400 to add additional operations or to omit some operations. The operations described in flowchart 1400 may be performed by, for example, one or more semiconductor fabrication systems that include a patterning system, a deposition system, an etching system, or any combination thereof.

At block 1410, a patterned etch mask (e.g., a hard mask) may be formed on a substrate (e.g., a $Si_3N_4$ or SiC substrate). The patterned etch mask may include a 2-D pattern (e.g., in a horizontal or x-y plane perpendicular to the surface-normal direction of the substrate) that matches the target 2-D pattern of the grating to be manufactured. For example, the patterned etch mask may have the same grating periods and duty cycles as the grating periods and duty cycles of the grating to be manufactured. In some embodiments, the patterned etch mask may have different periods and/or different duty cycles in different regions. The patterned etch mask may have a very low etch rate, and, in some embodiments, may include a metal material, such as Cr. In some embodiments, the patterned etch mask may be formed by a lithography process. For example, an etch mask layer may be deposited on the substrate; a photoresist layer may be deposited on the etch mask layer and exposed to light through a photomask; the exposed photoresist layer may be developed (e.g., using aqueous alkaline) to form the desired pattern in the photoresist layer; and a dry or wet etching process may then be performed to transfer the pattern formed in the photoresist layer onto the etch mask layer. In some embodiments, the etch mask layer may be pre-manufactured and then laminated onto the substrate. In some embodiments, the patterned etch mask may be formed by a laser ablation, an electron beam lithography, an interference lithography, a multi-photon lithography, a scanning probe lithography, or some combinations thereof.

Optionally, a deposition system may deposit an anti-reflective layer (e.g., a bottom anti-reflective coating (BARC) layer) on the patterned etch mask. The deposition may include, for example, spin coating, spray coating, physical vapor deposition, chemical vapor deposition, an atomic layer deposition, or the like. In some embodiments, the anti-reflective layer may include one or more dielectric layers that may cause destructive interferences between light reflected at different surfaces of the one or more dielectric layers to reduce the effective reflection of the anti-reflective layer. In some embodiments, alternatively or additionally, the anti-reflective layer may include an absorptive material that may absorb the light used for photolithography to attenuate the exposure light passing through the anti-reflective layer, thereby reducing the light reflection at the interface between the anti-reflective layer and the substrate (or the patterned etch mask). The anti-reflective layer may have an etch rate comparable to (e.g., similar to or slightly lower or greater than) the etch rate of the substrate, such as quartz, silicon, silicon nitride, and the like.

At block 1420, a deposition system may deposit a photoresist material layer on the patterned etch mask. The deposition may include, for example, spin coating, spray coating, or the like. In some embodiments, the photoresist material layer may include a thermally crosslinkable photoresist described herein. For example, the photoresist material layer may include the thermally crosslinkable photoresists described above. In some embodiments, the photoresist material layer may include one or more crosslinking agents (e.g., aromatic) such that the thermally crosslinkable photoresist may crosslink at a bake temperature below the degradation temperature (e.g., the glass-transition temperature $T_g$) of photoresist. In one example, the photoresist material layer may include novolac resins (e.g., a phenolic novolac resin) with molecular weights about 1 k and 100 k (e.g., between about 2 k and about 50 k, such as about 10 k), DNQ compounds, and 0 to 3 crosslinking agents (e.g., no crosslinking agent, one crosslinking agent, or a blend of two or three crosslinking agents) at about 0.1 to about 20 wt %. In some embodiments, the thermally crosslinkable photoresist may include an organic casting solvent, such as cyclohexanone, acetone, ethyl lactate, 1-methyl-2-pyrrolidinone (NMP), diglyme (diethyleneglycol dimethyl ether), and propyleneglycol methyl ether acetate (PGMEA). The thermally crosslinkable photoresist may be a positive-tone photoresist material, which, upon exposure, may become more soluble in a photoresist developer, such that the exposed portions of the photoresist material layer may be removed by the development process. The photoresist material may have a non-binary (linear or nonlinear) response to exposure dose such that the depth of an exposed portion of the photoresist material layer may correlate with the exposure dose at the exposed portion. The photoresist material may further be characterized by an etch rate comparable to (e.g., similar to or greater than) the etch rate of the substrate, such as quartz, silicon, silicon nitride, SiC, and the like. After the deposition, the photoresist material layer may be baked at a relative low temperature (e.g., at or below about 100° C., such as about 95-100° C.) to remove the solvent in the photoresist.

Optionally, a deposition system may deposit an anti-reflective layer (e.g., a top anti-reflective coating (TARC)) on the photoresist material layer. The deposition may include, for example, spin coating, spray coating, physical vapor deposition, chemical vapor deposition, an atomic layer deposition, or the like. In some embodiments, the TARC layer may include one or more dielectric layers that may cause destructive interferences between light reflected at different surfaces of the one or more dielectric layers to reduce the effective reflection of the anti-reflective layer. In some embodiments, the TARC layer may have an etch rate comparable to (e.g., similar to or slightly lower or greater than) the etch rate of photoresist material or the substrate, such as quartz, silicon, silicon nitride, and the like.

At block 1430, the photoresist material layer may be exposed to, for example, ultra-violet (UV) light or deep UV light, through a variable transparency photomask (e.g., a gray-scale photomask). The variable transparency photomask may be characterized by a transmissivity function correlated with the desired depth profile of the photoresist material layer, the desired depth profile (e.g., uniform or non-uniform depth profile) of the grating to be fabricated, and/or the duty cycle of the grating to be fabricated. For example, the variable transparency photomask may include multiple levels of light transmission rate or may include a continuously varying light transmission rate. In some embodiments, the variable transparency photomask may include a metal layer or another partially UV-blocking material layer having a varying thickness. The variable transparency photomask may selectively transmit UV radiation of different intensity levels to modulate the dose of UV radiation on the photoresist material layer and thus the exposure depth of the photoresist material layer.

At block 1440, the exposed photoresist material layer may be developed using a photoresist developer to remove (e.g., dissolve) the exposed portions from the photoresist material layer and form a patterned photoresist layer having a non-uniform thickness. The development process can include immersion development, puddle development, spray development, and the like. The photoresist developer may include, for example, a diluted sodium hydroxide or potassium hydroxide solution, an aqueous solution of metal-ion-free organic TetraMethylAmmoniumHydroxide (TMAH), or an organic solvent.

At block 1450, the patterned photoresist layer may be baked at an elevated temperature (e.g., greater than 100° C., such as at or below 200° C. or higher) for a period of time (e.g., a few minutes), such that the patterned photoresist layer may crosslink to form a crosslinked photoresist layer that may have a higher density, a higher hardness, a lower etch rate, and/or a higher glass transition temperature. When the photoresist material layer includes one or more crosslinking agents, the patterned photoresist layer may completely crosslink at a lower baking temperature (e.g., below about 250° C. or below about 200° C.) and/or a shorter baking time.

At block 1460, the crosslinked photoresist layer and the substrate may be etched to transfer the thickness profile of the crosslinked photoresist layer into the substrate, thus achieving the uniform or non-uniform etch depth in the substrate as described with respect to, for example, FIGS. 5A, 5B, 7D, 7E, 10, and 12E. For example, surface-relief gratings with variable duty cycles (e.g., between about 10%-90%, between about 20-80%, between about 30-70%, or between about 40-60%) may be fabricated to have uniform or non-uniform etch depths. The etching may include straight etching or slanted etching. The etching may include, for example, RIE or IBE. In any of these etching techniques, the etch rate of the photoresist material may be comparable to or greater than the etch rate of the substrate in order to transfer the thickness profile of the patterned photoresist layer to the substrate. For example, the etch rate of the crosslinked patterned photoresist layer may be between about 0.5 to about 5 times of the etch rate of the substrate, between about 0.6 to about 3 times of the etch rate of the substrate, between about 0.7 to about 2 times of the etch rate of the substrate, between about 0.8 to about 1.5 times of the etch rate of the substrate, between about 0.9 to about 1.2 times of the etch rate of the substrate, and the like. As described above, because of the high glass transition temperature of the crosslinked photoresist layer, etching the crosslinked photoresist layer in an etching chamber (which may be at a high temperature) may not make the crosslinked photoresist layer flowable, and thus may not form ripples on the etched surfaces of the crosslinked photoresist layer. Therefore, etching the crosslinked photoresist layer may result in smooth surfaces with roughness in a range of a few nanometers to a few tens of nanometers.

At block 1470, the remaining photoresist (if any) and the patterned etch mask may be removed from the substrate using one or more solvents or other removers or strippers to expose the substrate that includes a grating structure with uniform or varying depth etched therein. The grating structure may be a final product of a variable-etch-depth grating or may be used as a master mold for imprinting variable-etch-depth gratings.

In some embodiments, an overcoat layer having a refractive index different from the refractive index of the substrate may be coated on the surface-relief grating to protect the surface-relief grating. In some embodiments, an antireflective coating may be formed on the surface-relief grating and the overcoat layer to reduce light reflection at the surface of the grating.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 15:
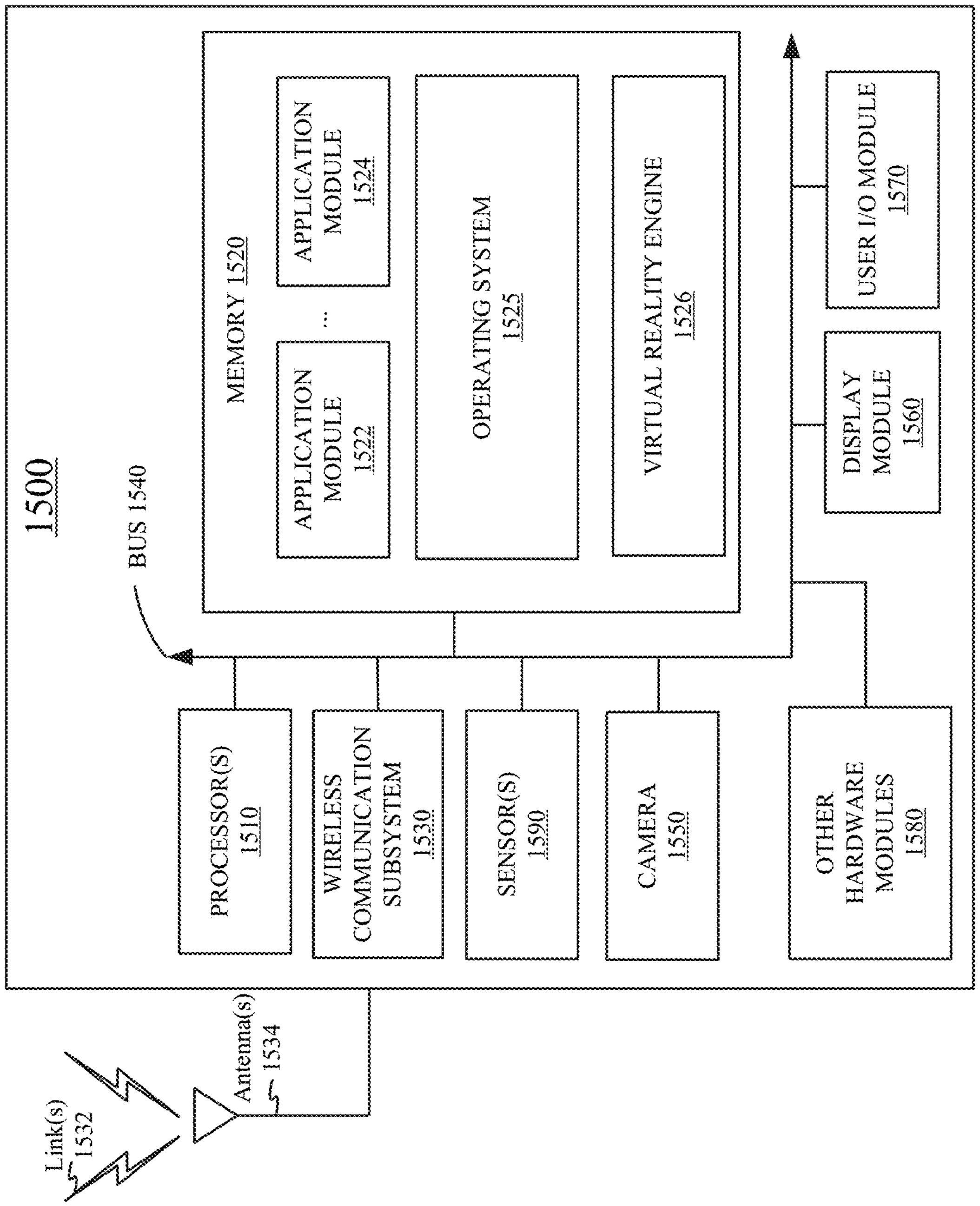
FIG. 15 is a simplified block diagram of an electronic system of an example of a near-eye display according to certain embodiments.

FIG. 15 is a simplified block diagram of an example electronic system 1500 of an example near-eye display (e.g., HMD device) for implementing some of the examples disclosed herein. Electronic system 1500 may be used as the electronic system of an HMD device or other near-eye displays described above. In this example, electronic system 1500 may include one or more processor(s) 1510 and a memory 1520. Processor(s) 1510 may be configured to execute instructions for performing operations at a number of components, and can be, for example, a general-purpose processor or microprocessor suitable for implementation within a portable electronic device. Processor(s) 1510 may be communicatively coupled with a plurality of components within electronic system 1500. To realize this communicative coupling, processor(s) 1510 may communicate with the other illustrated components across a bus 1540. Bus 1540 may be any subsystem adapted to transfer data within electronic system 1500. Bus 1540 may include a plurality of computer buses and additional circuitry to transfer data.

Memory 1520 may be coupled to processor(s) 1510. In some embodiments, memory 1520 may offer both short-term and long-term storage and may be divided into several units. Memory 1520 may be volatile, such as static random access memory (SRAM) and/or dynamic random access memory (DRAM) and/or non-volatile, such as read-only memory (ROM), flash memory, and the like. Furthermore, memory 1520 may include removable storage devices, such as secure digital (SD) cards. Memory 1520 may provide storage of computer-readable instructions, data structures, program modules, and other data for electronic system 1500. In some embodiments, memory 1520 may be distributed into different hardware modules. A set of instructions and/or code might be stored on memory 1520. The instructions might take the form of executable code that may be executable by electronic system 1500, and/or might take the form of source and/or installable code, which, upon compilation and/or installation on electronic system 1500 (e.g., using any of a variety of generally available compilers, installation programs, compression/decompression utilities, etc.), may take the form of executable code.

In some embodiments, memory 1520 may store a plurality of application modules 1522 through 1524, which may include any number of applications. Examples of applications may include gaming applications, conferencing applications, video playback applications, or other suitable applications. The applications may include a depth sensing function or eye tracking function. Application modules 1522-1724 may include particular instructions to be executed by processor(s) 1510. In some embodiments, certain applications or parts of application modules 1522-1724 may be executable by other hardware modules 1580. In certain embodiments, memory 1520 may additionally include secure memory, which may include additional security controls to prevent copying or other unauthorized access to secure information.

In some embodiments, memory 1520 may include an operating system 1525 loaded therein. Operating system 1525 may be operable to initiate the execution of the instructions provided by application modules 1522-1724 and/or manage other hardware modules 1580 as well as interfaces with a wireless communication subsystem 1530 which may include one or more wireless transceivers. Operating system 1525 may be adapted to perform other operations across the components of electronic system 1500 including threading, resource management, data storage control and other similar functionality.

Wireless communication subsystem 1530 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1500 may include one or more antennas 1534 for wireless communication as part of wireless communication subsystem 1530 or as a separate component coupled to any portion of the system. Depending on desired functionality, wireless communication subsystem 1530 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1530 may permit data to be exchanged with a network, other computer systems, and/or any other devices described herein. Wireless communication subsystem 1530 may include a means for transmitting or receiving data, such as identifiers of HMD devices, position data, a geographic map, a heat map, photos, or videos, using antenna(s) 1534 and wireless link(s) 1532. Wireless communication subsystem 1530, processor(s) 1510, and memory 1520 may together comprise at least a part of one or more of a means for performing some functions disclosed herein.

Embodiments of electronic system 1500 may also include one or more sensors 1590. Sensor(s) 1590 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1590 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1500 may include a display module 1560. Display module 1560 may be a near-eye display, and may graphically present information, such as images, videos, and various instructions, from electronic system 1500 to a user. Such information may be derived from one or more application modules 1522-1724, virtual reality engine 1526, one or more other hardware modules 1580, a combination thereof, or any other suitable means for resolving graphical content for the user (e.g., by operating system 1525). Display module 1560 may use liquid crystal display (LCD) technology, light-emitting diode (LED) technology (including, for example, OLED, ILED, μLED, AMOLED, TOLED, etc.), light emitting polymer display (LPD) technology, or some other display technology.

Electronic system 1500 may include a user input/output module 1570. User input/output module 1570 may allow a user to send action requests to electronic system 1500. An action request may be a request to perform a particular action. For example, an action request may be to start or end an application or to perform a particular action within the application. User input/output module 1570 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1500. In some embodiments, user input/output module 1570 may provide haptic feedback to the user in accordance with instructions received from electronic system 1500. For example, the haptic feedback may be provided when an action request is received or has been performed.

Electronic system 1500 may include a camera 1550 that may be used to take photos or videos of a user, for example, for tracking the user's eye position. Camera 1550 may also be used to take photos or videos of the environment, for example, for VR, AR, or MR applications. Camera 1550 may include, for example, a complementary metal-oxide-semiconductor (CMOS) image sensor with a few millions or tens of millions of pixels. In some implementations, camera 1550 may include two or more cameras that may be used to capture 3-D images.

In some embodiments, electronic system 1500 may include a plurality of other hardware modules 1580. Each of other hardware modules 1580 may be a physical module within electronic system 1500. While each of other hardware modules 1580 may be permanently configured as a structure, some of other hardware modules 1580 may be temporarily configured to perform specific functions or temporarily activated. Examples of other hardware modules 1580 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1580 may be implemented in software.

In some embodiments, memory 1520 of electronic system 1500 may also store a virtual reality engine 1526. Virtual reality engine 1526 may execute applications within electronic system 1500 and receive position information, acceleration information, velocity information, predicted future positions, or some combination thereof of the HMD device from the various sensors. In some embodiments, the information received by virtual reality engine 1526 may be used for producing a signal (e.g., display instructions) to display module 1560. For example, if the received information indicates that the user has looked to the left, virtual reality engine 1526 may generate content for the HMD device that mirrors the user's movement in a virtual environment. Additionally, virtual reality engine 1526 may perform an action within an application in response to an action request received from user input/output module 1570 and provide feedback to the user. The provided feedback may be visual, audible, or haptic feedback. In some implementations, processor(s) 1510 may include one or more GPUs that may execute virtual reality engine 1526.

In various implementations, the above-described hardware and modules may be implemented on a single device or on multiple devices that can communicate with one another using wired or wireless connections. For example, in some implementations, some components or modules, such as GPUs, virtual reality engine 1526, and applications (e.g., tracking application), may be implemented on a console separate from the head-mounted display device. In some implementations, one console may be connected to or support more than one HMD.

In alternative configurations, different and/or additional components may be included in electronic system 1500. Similarly, functionality of one or more of the components can be distributed among the components in a manner different from the manner described above. For example, in some embodiments, electronic system 1500 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/ or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, “and” and “or” as used herein, may include a variety of meanings that are also expected to depend at least in part upon the context in which such terms are used. Typically, “or” if used to associate a list, such as A, B, or C, is intended to mean A, B, and C, here used in the inclusive sense, as well as A, B, or C, here used in the exclusive sense. In addition, the term “one or more” as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term “at least one of” if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:

forming a patterned etch mask on a substrate;

depositing a photoresist material layer on the patterned etch mask, the photoresist material layer being thermally crosslinkable;

exposing the photoresist material layer to exposure light through a gray-scale photomask;

developing the exposed photoresist material layer to form a patterned photoresist layer having a non-uniform thickness;

baking the patterned photoresist layer at an elevated temperature to form a crosslinked photoresist layer; and etching the crosslinked photoresist layer and the substrate at a temperature lower than a glass transition temperature of the crosslinked photoresist layer but higher than a glass transition temperature of the patterned photoresist layer to form a surface-relief grating in the substrate.

2. The method of claim 1, wherein the photoresist material layer is characterized by a non-binary linear or nonlinear response to exposure light dose.

3. The method of claim 1, wherein etching the crosslinked photoresist layer and the substrate includes etching the crosslinked photoresist layer and the substrate using reactive ion etching or ion beam etching.

4. The method of claim 1, wherein the photoresist material layer includes one or more crosslinking agents configured to reduce a crosslink temperature of the photoresist material layer and/or lower an etch rate of the photoresist material layer.

5. The method of claim 4, wherein the one or more crosslinking agents include:

a heterocyclic compound or an aromatic compound; and one or more crosslinking function groups attached to the heterocyclic compound or the aromatic compound, the one or more crosslinking function groups including an alkoxy group, an epoxy group, a hydroxyl group, or a combination thereof.

6. The method of claim 4, wherein the one or more crosslinking agents include at least one of:

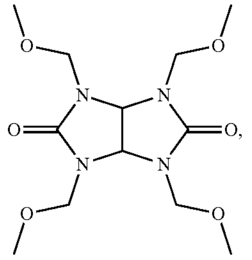

-continued

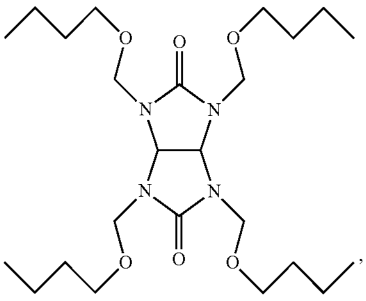

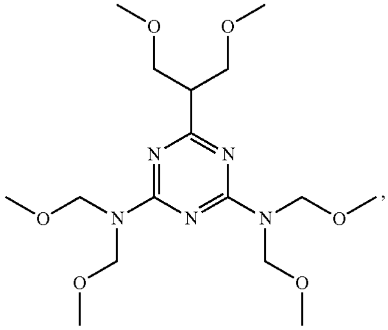

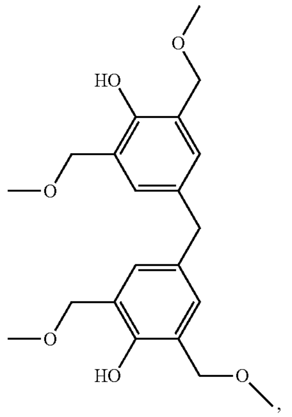

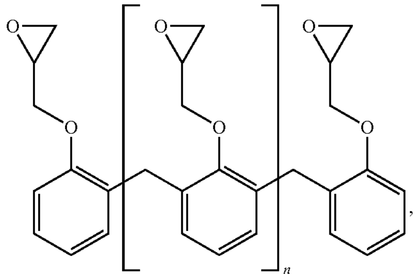

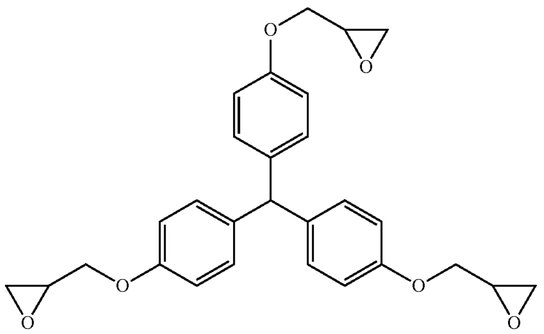

-continued

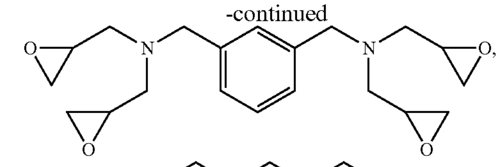

or

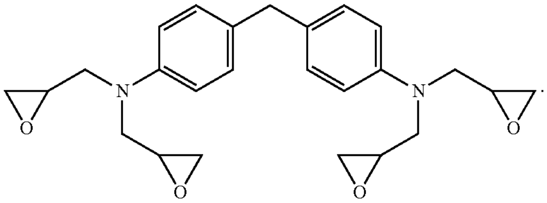

7. The method of claim 1, further comprising at least one of:

depositing, before depositing the photoresist material layer, a first anti-reflective coating layer on the patterned etch mask, or depositing, after depositing the photoresist material layer, a second anti-reflective coating layer on the photoresist material layer.

8. The method of claim 1, wherein etching the patterned photoresist layer and the substrate comprises etching the patterned photoresist layer and the substrate at a slant angle greater than 10° with respect to a surface normal direction of the substrate.

9. The method of claim 1, wherein the elevated temperature is greater than 100° C. and lower than 250° C.

10. The method of claim 1, wherein the crosslinked photoresist layer is characterized by a surface roughness less than 100 nm after the etching.

11. The method of claim 1, wherein:

the patterned etch mask includes a pattern characterized by a uniform or non-uniform duty cycle; and the surface-relief grating formed in the substrate is characterized by a uniform or non-uniform etch depth.

12. The method of claim 11, wherein the non-uniform etch depths are characterized by regions with different levels of depth formed from different levels of exposure doses.

13. The method of claim 1, wherein the gray-scale photomask is characterized by a continuously varying light transmission rate.

14. The method of claim 1, wherein the gray-scale photomask is characterized by a metal layer or another partially ultra-violet blocking material having a varying thickness.

15. A gray-tone photoresist comprising:

a novolac resin;

a diazonaphthoquinone (DNQ) dissolution inhibitor; and one or more crosslinking agents comprising imidazole rings and crosslinking function groups attached to each of the imidazole rings, wherein the crosslinking function groups are selected from the group consisting of hydroxyl, epoxy, and alkyl groups.

16. The gray-tone photoresist of claim 15, wherein the one or more crosslinking agents constitute 0.1 to 20 wt % of the gray-tone photoresist.

17. The gray-tone photoresist of claim 15, wherein the novolac resin is characterized by number average molecular weights between 1 k and 100 k.

18. The gray-tone photoresist of claim 15, wherein a crosslink temperature of the novolac resin is greater than 100° C. and is lower than 250° C.

19. The gray-tone photoresist of claim 15, wherein the one or more crosslinking agents comprise a heterocyclic compound having a first imidazole ring and a second imidazole ring, wherein the crosslinking function groups are attached to the first imidazole ring and the second imidazole ring.

20. The gray-tone photoresist of claim 15, wherein the crosslinking function groups comprise epoxy groups attached to the imidazole rings and are configured to react with phenolic hydroxyl groups of the novolac resin.

* * * * *